(12) United States Patent
Park et al.

(10) Patent No.: US 11,646,097 B2
(45) Date of Patent: May 9, 2023

(54) STACKED MEMORY DEVICE AND TEST METHOD THEREOF

(71) Applicant: SK hynix Inc., Gyeonggi-do (KR)

(72) Inventors: Young Jun Park, Gyeonggi-do (KR); Young Jun Ku, Gyeonggi-do (KR); In Keun Kim, Gyeonggi-do (KR); Sang Sic Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/540,882

(22) Filed: Dec. 2, 2021

(65) Prior Publication Data
US 2023/0011546 A1    Jan. 12, 2023

(30) Foreign Application Priority Data
Jul. 6, 2021 (KR) .................. 10-2021-0088473

(51) Int. Cl.
| | |
|---|---|
| *G11C 29/54* | (2006.01) |
| *H01L 25/065* | (2023.01) |
| *H01L 25/18* | (2023.01) |
| *G11C 7/10* | (2006.01) |
| *G11C 7/22* | (2006.01) |

(52) U.S. Cl.
CPC ............ *G11C 29/54* (2013.01); *G11C 7/1069* (2013.01); *G11C 7/1096* (2013.01); *G11C 7/222* (2013.01); *H01L 25/0657* (2013.01); *H01L 25/18* (2013.01); *H01L 2225/06513* (2013.01); *H01L 2225/06541* (2013.01)

(58) Field of Classification Search
None
See application file for complete search history.

(56) References Cited

U.S. PATENT DOCUMENTS

| | | | | |
|---|---|---|---|---|
| 2006/0279308 A1* | 12/2006 | Ong | ............... | G01R 31/318513 324/750.3 |
| 2017/0062309 A1* | 3/2017 | Ogras | ............... | H01L 23/49894 |
| 2019/0302181 A1 | 10/2019 | Dono | | |
| 2022/0059178 A1* | 2/2022 | Moon | ............... | G11C 29/12015 |
| 2022/0133795 A1* | 5/2022 | Karyampudi | .......... | A61K 35/17 424/93.71 |

* cited by examiner

*Primary Examiner* — Tan T. Nguyen
(74) *Attorney, Agent, or Firm* — IP & T Group LLP

(57) ABSTRACT

A memory device includes a data pad; a read circuit outputting read or test data to the data pad according to a read timing signal and a read command; a write circuit receiving write data through the data pad according to a write timing signal; a test register circuit performing a preset operation on data and storing the data, and transferring the stored data as the test data in response to the read command, during a first test mode; a data compression circuit generating a test output signal by compressing the test data and outputting the test output signal to a first test output pad, during the first test mode; and a timing control circuit generating, according to first to third output control signals, the read timing signal and generating the write timing signal by delaying the read timing signal, during the first test mode.

20 Claims, 19 Drawing Sheets

STACKED MEMORY DEVICE AND TEST METHOD THEREOF

CROSS-REFERENCE TO RELATED APPLICATIONS

The present application claims priority to Korean Patent Application No. 10-2021-0088473, filed on Jul. 6, 2021, which is incorporated herein by reference in its entirety.

BACKGROUND

1. Field

Various embodiments of the present disclosure relate to semiconductor design technology, and more particularly, to a method of testing a stacked memory device.

2. Description of the Related Art

As semiconductor technology makes dramatic progress, semiconductor integrated devices such as packages are required to have a higher degree of integration and performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate.

For a stacked memory device, a plurality of micro-bumps may be disposed to facilitate physical contact between stacked memory chips. Because various signals are transmitted between the stacked memory chips through through-electrodes TSVs and micro-bumps, tests are needed to determine whether they are connected normally.

SUMMARY

Various embodiments of the present disclosure are directed to a stacked memory device capable of feeding back data through read/write paths and testing circuits on the read/write paths and data pads by using the fed-back data.

Various embodiments of the present disclosure are directed to a stacked memory device capable of testing data pads, a write strobe pad, and a read strobe pad, respectively.

In accordance with an embodiment of the present disclosure, a memory device includes at least one data pad; a read circuit suitable for outputting read data or test data to the data pad in synchronization with a read timing signal, according to a read command; a write circuit suitable for receiving write data through the data pad in synchronization with a write timing signal; a test register circuit suitable for performing a preset operation on data outputted from the write circuit and storing therein the preset-operated data, and transferring the stored data as the test data in response to the read command, during a first test mode; a data compression circuit suitable for generating a test output signal by compressing the test data outputted from the read circuit and outputting the test output signal to a first test output pad, during the first test mode; and a timing control circuit suitable for generating, according to first to third output control signals, the read timing signal corresponding to a test clock inputted from at least one test input pad and generating the write timing signal by delaying the read timing signal, during the first test mode.

In accordance with an embodiment of the present disclosure, a memory device includes a first strobe pad through which a write strobe signal inputted; a clock multiplier suitable for receiving a test clock inputted from at least one test input pad and generating a test seed clock by multiplying a frequency of the test clock; a first output circuit suitable for outputting the test seed clock as the write strobe signal to the first strobe pad in response to a second test mode signal; a first input circuit suitable for receiving the write strobe signal transferred through the first strobe pad; a clock divider suitable for generating an internal clock by dividing a frequency of the write strobe signal transferred from the first input circuit; and a counter suitable for generating a counting signal by counting a toggling number of the internal clock and outputting respective bits of the counting signal to at least one test output pad.

In accordance with an embodiment of the present disclosure, a memory device includes a second strobe pad through which a read strobe signal is outputted; an output control circuit suitable for receiving a test clock inputted from at least one test input pad and generating a read timing signal corresponding to the test clock in response to first to third output control signals, while selectively masking the first to third output control signals in response to a third test mode signal; a strobe generation circuit suitable for generating an internal strobe signal based on the read timing signal; a second output circuit suitable for outputting the internal strobe signal as the read strobe signal to the second strobe pad; a second input circuit suitable for receiving, in response to the third test mode signal, the read strobe signal transferred through the second strobe pad; and a counter suitable for generating a counting signal by counting the toggling number of the read strobe signal and outputting respective bits of the counting signal to at least one test output pad.

In accordance with an embodiment of the present disclosure, a method of a memory device includes generating a read timing signal corresponding to a clock inputted through an input pad; generating a write timing signal by delaying the read timing signal; receiving, through a data pad, write data in synchronization with the write timing signal to store the write data in a register; outputting, through the data pad in response to a read command, the stored data in synchronization with the read timing signal; and compressing the stored data to generate an output signal to be outputted through an output pad.

In accordance with an embodiment of the present disclosure, a method of a memory device includes generating a seed clock by multiplying a frequency of an input clock inputted through an input pad; outputting the seed clock as a strobe signal through a strobe pad; generating an internal clock by dividing a frequency of the strobe signal; and counting a toggling number of the internal clock to generate a counting signal to be outputted through an output pad.

In accordance with an embodiment of the present disclosure, a method of a memory device includes generating, according to selectively masked control signals, a timing signal corresponding to a clock inputted through an input pad; generating a strobe signal based on the timing signal to output the strobe signal through a strobe pad; and counting a toggling number of the strobe signal to generate a counting signal to be outputted through an output pad.

In accordance with the present technology, during a test operation, a stacked memory device may feed back data through the read/write paths thereof. Furthermore, it is possible to perform an operation on the fed-back data and confirm an operation result through a test path of the memory device. Consequently, various circuits on the read/write paths of the memory device may be tested by using a limited number of test pads on the test paths. Furthermore, it is possible to improve test operation efficiency of the memory device, to reduce the fabricating cost of the memory device.

Further, in accordance with the present technology, during a test operation, a stacked memory device may provide a new method of testing circuits on the read/write path, the data pads, the write strobe pad, and the read strobe pad when the specification changes. Thus, the test operation scalability of the memory device may be improved.

These and other features and advantages of the present disclosure will become apparent to those skilled in the art from the following detailed description in conjunction with the following drawings.

DETAILED DESCRIPTION

Figure 1:
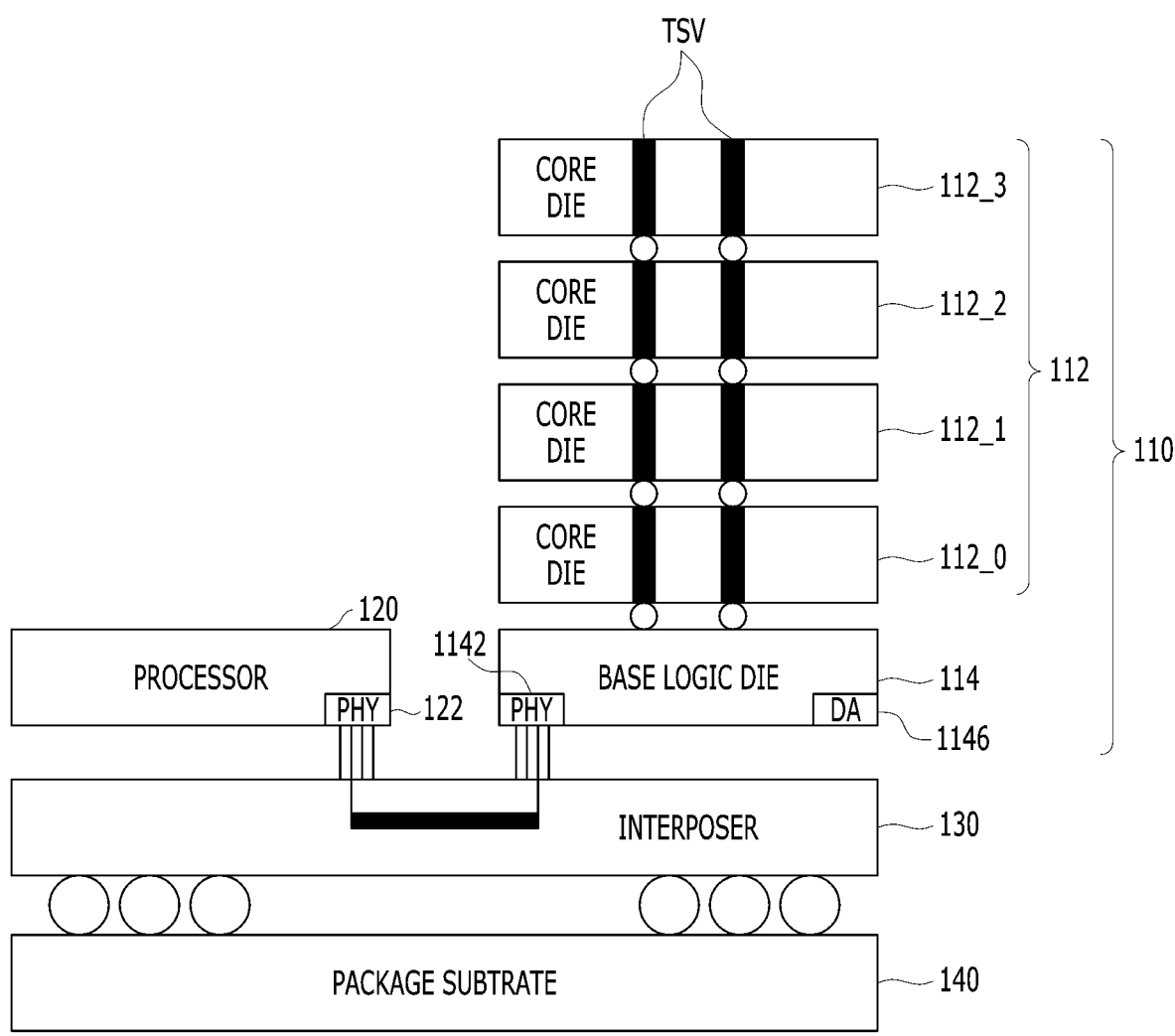
FIG. 1 is a cross-sectional diagram illustrating a semiconductor system in accordance with various embodiments of the present disclosure.

Various embodiments of the present disclosure will be described below in more detail with reference to the accompanying drawings. The present disclosure may, however, be embodied in different forms and should not be construed as being limited to the embodiments set forth herein. Rather, these embodiments are provided so that this disclosure will convey the scope of the present teachings to those skilled in the art. Throughout the disclosure, like reference numerals refer to like parts throughout the various figures and embodiments of the present disclosure.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present teachings.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise.

The articles 'a' and 'an' as used in this application and the appended claims should generally be construed to mean 'one or more' unless specified otherwise or it is clear from context to be directed to a singular form.

A semiconductor memory system in accordance with an embodiment of the present disclosure may be embodied in the form of a system-in-package, a multi-chip package, or a system-on-chip, and it may also be embodied in the form of a package-on-package. Hereinafter, a semiconductor memory system including a stacked memory device will be described.

FIG. 1 is a cross-sectional diagram illustrating a semiconductor system 100 in accordance with various embodiments of the present disclosure.

Referring to FIG. 1, the semiconductor system 100 may include a stacked memory device 110, a controller 120, an interposer 130, and a package substrate 140.

The interposer 130 may be mounted onto the package substrate 140.

The stacked memory device 110 and the controller 120 may be mounted onto the interposer 130.

Because the controller 120 is generally included in diverse processors, such as a Central Processing Unit (CPU), a Graphic Processing Unit (GPU), and an Application Processor (AP), the controller 120 may be also referred to as a processor as designated in FIG. 1.

A physical area (PHY) 1142 of the stacked memory device 110 may be coupled to a physical area (PHY) 122 of the controller 120 via the interposer 130. An interface circuit for communication between the stacked memory device 110 and the controller 120 may be disposed in each of the physical areas 1142 and 122.

The stacked memory device 110 may form a High Bandwidth Memory (HBM). The HBM may have a high bandwidth corresponding to the increased number of I/O units resulting from stacking a plurality of dies (i.e., memory chips) in a vertical direction and electrically connecting them through through-electrodes TSVs.

The plurality of dies may include a base logic die 114 and a plurality of core dies 112. The core dies 112 may be sequentially stacked over the base logic die 114, and coupled to each other through the through-electrodes TSVs. Although FIG. 1 shows that four core dies 112, that is, first to fourth core dies 112_0 to 112_3, are stacked, the concept and spirit of the present disclosure are not limited thereto and the number of the stacked core dies may vary depending on the design of the memory device.

Each of the core dies 112 may be implemented with a memory chip. Each of the core dies 112 may include a plurality of memory cells for storing data and circuits for supporting a core operation on the memory cells. The base logic die 114 may act as an interface between the core dies 112 and the controller 120 so that various functions within the semiconductor system 100, such as a memory management function (e.g., a refresh management function and a power management function for the memory cells), and a timing adjustment function between the core dies 112 and the controller 120, may be performed.

In various embodiments, the base logic die 114 may include the physical area 1142 and a direct access area (DA) 1146. In the physical area 1142, an interface circuit for communication with the controller 120 may be disposed. In the direct access area 1146, an interface circuit for directly testing the stacked memory device 110 may be disposed. The base logic die 114 is also referred to as a buffer die.

Figure 2:
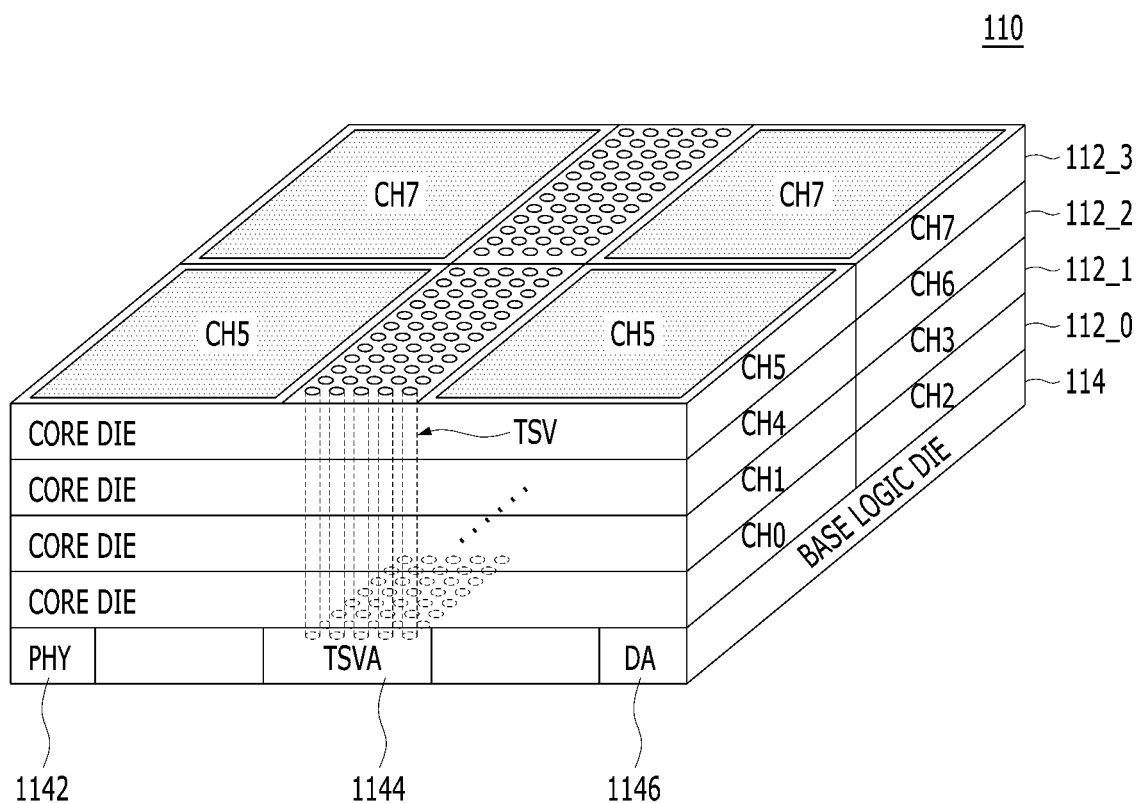
FIG. 2 is a perspective view illustrating a stacked memory device shown in FIG. 1 in accordance with an embodiment of the present disclosure.

FIG. 2 is a perspective view of the stacked memory device 110 shown in FIG. 1 in accordance with an embodiment of the present disclosure Referring to FIG. 2, each of the first to fourth core dies 112_0 to 112_3 may include one or more channels. In the example of FIG. 2, as one core die includes two channels, the stacked memory device 110 may have first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs passing through the first to fourth core dies 112_0 to 112_3 may be disposed corresponding to the first to eighth channels CH0 to CH7, respectively. When each channel has a bandwidth of 128 bits (i.e., two 128-bit channels per die), the through-electrodes TSVs and corresponding I/O units may be configured to transfer 1024 bits of data. Each channel may be similar to a standard double data rate (DDR) interface, but may be completely independent and therefore each channel within one stacked memory device and even within one die may operate at a different frequency and/or different timings.

The base logic die 114 may communicate with the controller 120 (see FIG. 1). For example, the base logic die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114. The physical area (PHY) 1142 may be the same part as the physical area (PHY) 1142 shown in FIG. 1, and the direct access area (DA) 1146 may be the same part as the direct access area (DA) 1146 shown in FIG. 1.

The physical area 1142 may be provided with an I/O circuit for interfacing with the controller 120. The physical area 1142 may be disposed in a first edge area of the base logic die 114, adjacent to the controller 120. The direct access area 1146 may be provided with an I/O circuit for directly interfacing with an external test device (not shown). The direct access area 1146 may be disposed in a second edge area of the base logic die 114, adjacent to the external test device.

The second edge area may be disposed in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at the central area of the base logic die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 to transfer the buffered signals to the first to fourth core dies 112_0 to 112_3 through the through-electrodes TSVs.

Figure 3:
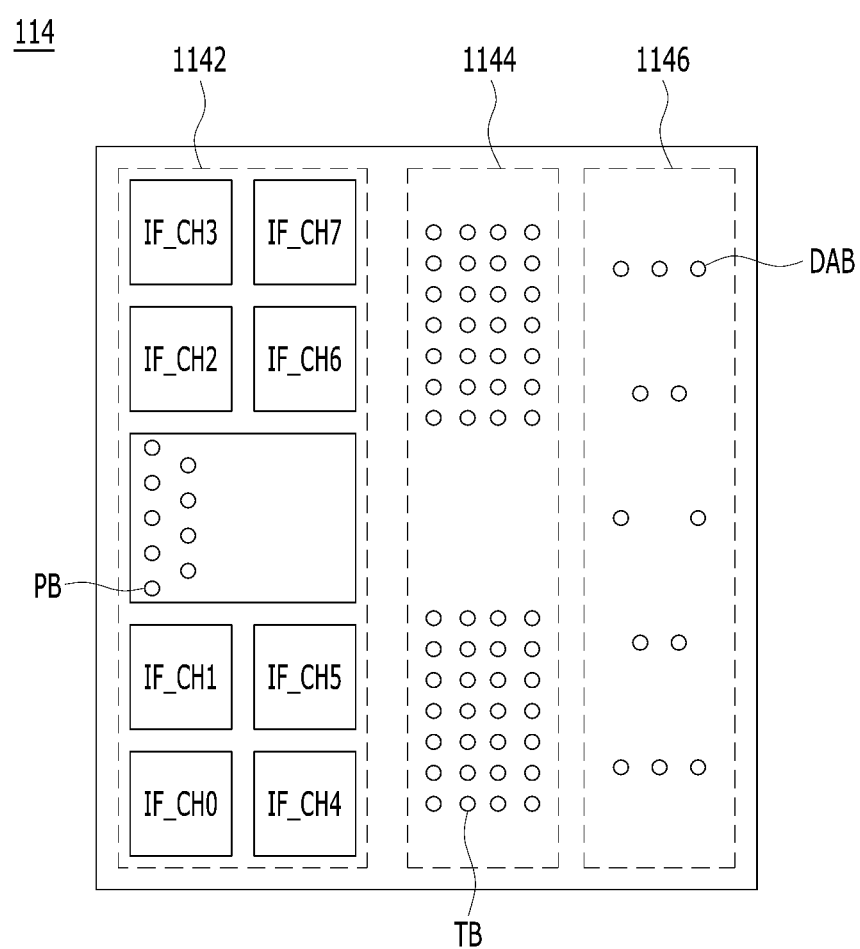
FIG. 3 is a plane view for describing bumps disposed on a base logic die shown in FIG. 2 in accordance with an embodiment of the present disclosure.

FIG. 3 is a plane view for describing bumps disposed on the base logic die 114 shown in FIG. 2 in accordance with an embodiment of the present disclosure.

Referring to FIG. 3, the physical area 1142, the TSV area 1144, and the direct access area 1146 may be disposed in the base logic die 114. In the physical area 1142, channel interface areas IF_CH0 to IF_CH7 for interfacing with the first to eighth channels CH0 to CH7 of the first to fourth core dies 112_0 to 112_3 may be disposed.

A plurality of PHY bumps PB for interfacing with the controller 120 may be formed on the physical area 1142. A plurality of TSV bumps TB for interfacing with the through-electrodes TSVs may be formed on the TSV area 1144. A plurality of DA bumps DAB for interfacing with an external test device through the interposer 130 to test the stacked memory device 110, may be formed on the direct access area 1146. The PHY bumps PB, the TSV bumps TB and the DA bumps DAB may be formed of micro-bumps. Though it is not shown, a plurality of DA probing pads DAP coupled to the DA bumps DAB may be additionally formed on the direct access area 1146. The DA probing pads DAP may be relatively larger in physical size than the PHY bumps PB and the DA bumps DAB.

Since the physical size of the PHY bumps PB is very small and the number of the PHY bumps PB is very large with more than 1000, it is difficult to test the stacked memory device 110 using the PHY bumps PB. Furthermore, since the stacked memory device 110 communicates with the controller 120 in the form of a system-in-package (SIP), it is more difficult to test the stacked memory device 110 using the PHY bumps PB. For those reasons, the stacked memory device 110 may be tested using the DA bumps DAB or the DA probing pads DAP, which are relatively larger in physical size and smaller in number than the PHY bumps PB.

As described above, the stacked memory device 110 may be tested using only DA bumps or DA probing pads, and it is difficult to directly use PHY bumps PB such as data pads, a write strobe pad, and a read strobe pad, which actually communicate with the controller 120 inside the package. Conventionally, during a test operation, a method of testing circuits on read/write paths, data pads, a write strobe pad, and a read strobe pad at once has been proposed through the following operations. First, the base logic die 114 generates a read strobe signal RDQS using a signal provided through the DA bump DAB, and outputs data through an output circuit connected to the data pads. The base logic die 114 outputs the read strobe signal RDQS through a read strobe pad and receives the read strobe signal RDQS again through the write strobe pad to generate a write strobe signal WDQS. The base logic die 114 receives data fed back through an input circuit connected to the data pads according to the write strobe signal WDQS, and outputs the data through the DA bump DAB. Finally, an external test device may verify the circuits on read/write paths, the data pads, the write strobe pad, and the read strobe pad at once using the data output through the DA bump DAB.

However, as the Joint Electron Device Engineering Council (JEDEC) standard for high bandwidth memory (HBM) has been updated to HBM 3.0, e.g., the specification of the stacked memory device 110 is revised to HBM 3.0, a clock signal of a predetermined period may be input through a write strobe pad even during a read operation. For this reason, it is difficult to test the circuits on the read/write paths, the data pads, the write strobe pad, and the read strobe pad using the existing test method. Accordingly, there is a need for a new method for evaluating the circuits on the read/write paths, the data pads, the write strobe pad, and the read strobe pad. Hereinafter, a test method capable of separating and evaluating the data pads, a write strobe pad, and a read strobe pad will be described.

Figure 4:
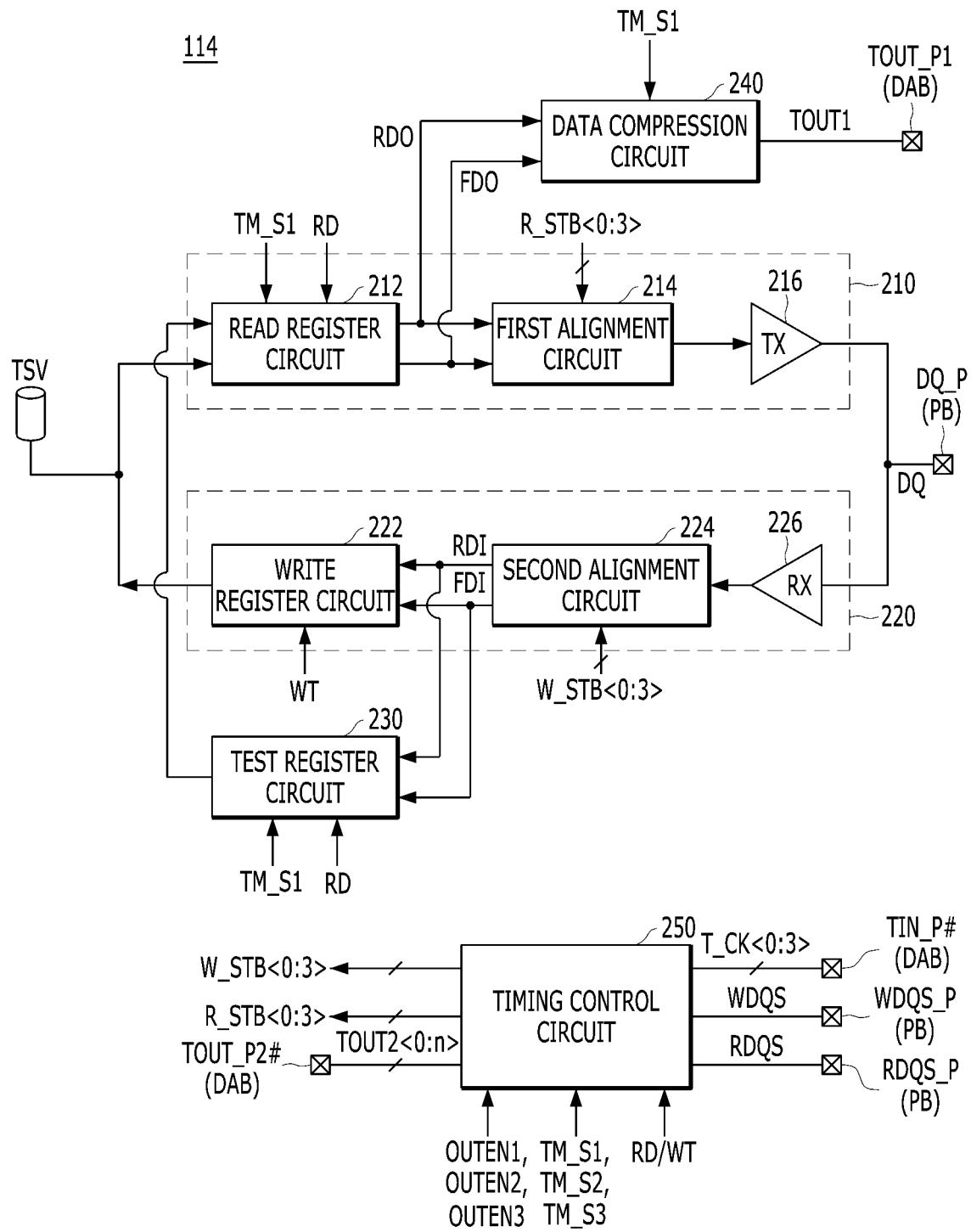
FIG. 4 is a configuration diagram illustrating a base logic die in accordance with an embodiment of the present disclosure.

FIG. 4 is a configuration diagram illustrating a base logic die 114 in accordance with an embodiment of the present disclosure.

Referring to FIG. 4, the base logic die 114 may be coupled to core dies (112 of FIG. 1) through a plurality of through-electrodes TSV.

The base logic die 114 may transmit and receive data to/from a controller (120 of FIG. 1) through a plurality of data pads DQ_P, a write strobe pad WDQS_P, and a read strobe pad RDQS_P. For reference, one or more data pads DQ_P may be provided according to the bit number of input/output data. The base logic die 114 may transmit and receive data to/from an external device (e.g., a test device) through a plurality of test input pads TIN_P #, a first test output pad TOUT_P1, and a plurality of second test output pads TOUT_P2 #. As described in FIGS. 1 to 3, the base logic die 114 may include a physical area (1142 of FIG. 3) in which an interface circuit for communication with the controller 120 is disposed, a TSV area (1144 of FIG. 3) in which the through-electrodes TSV for interfacing with the core dies is disposed, and a direct access area (1146 of FIG. 3) in which an interface circuit for directly testing the stacked memory device 110 may be disposed. That is, the through-electrodes TSV may be disposed in the TSV area 1144. The data pads DQ_P, the write strobe pad WDQS_P, and the read strobe pad RDQS_P may be formed as PHY bumps PB and disposed in the physical area 1142. The test input pads TIN_P #, the first test output pad TOUT_P1, and the plurality of second test output pads TOUT_P2 # may be formed as DA bumps DAB and disposed in the direct access area 1146.

In accordance with an embodiment of the present invention, a test operation may include a first test mode for evaluating circuits (i.e., a read circuit 210 and a write circuit 220) on read/write paths and the data pads DQ_P, a second test mode for evaluating the write strobe pad WDQS_P, and a third test mode for evaluating the read strobe pad RDQS_P. In FIG. 4, a first test mode signal TM_S1 is enabled in the first test mode, a second test mode signal TM_S2 is enabled in the second test mode, and a third test mode signal TM_S3 is enabled in the third test mode.

The base logic die 114 may include the read circuit 210, the write circuit 220, a test register circuit 230, a data compression circuit 240, and a timing control circuit 250.

The read circuit 210 may receive read data transmitted through the through-electrodes TSV from the core dies 112, or test data transmitted from the test register circuit 230, according to a read command RD. The read circuit 210 may output the read data or the test data to the data pads DQ_P in synchronization with a read timing signal R_STB<0:3>.

In detail, the read circuit 210 may include a read register circuit 212, a first alignment circuit 214, and an output circuit (TX) 216.

The read register circuit 212 may store the read data outputted from the core dies 112 or the test data transmitted from the test register circuit 230, according to the read command RD. The read register circuit 212 may output the stored data as parallel data RDO and FDO. Depending on an embodiment, the read register circuit 212 may select one of the read data and the test data according to the first test mode signal TM_S1. The first alignment circuit 214 may serialize the parallel data RDO and FDO, which are outputted from the read register circuit 212, based on the read timing signal R_STB<0:3>. The first alignment circuit 214 may transmit the serialized data to the output circuit 216. The output circuit 216 may output the serialized data through the data pad DQ_P as read data DQ.

The write circuit 220 may receive write data transferred through the data pad DQ_P according to a write command WT, and transfer the write data to the core dies 112 through the through-electrodes TSV in synchronization with a write timing signal W_STB<0:3>.

In detail, the write circuit 220 may include a write register circuit 222, a second alignment circuit 224, and an input circuit (RX) 226.

The input circuit 226 may receive the write data DQ transmitted from the controller 120 through the data pad DQ_P. The second alignment circuit 224 may align data outputted from the input circuit 226, in parallel, based on the write timing signal W_STB<0:3>, to output parallel data RDI and FDI. The write register circuit 222 may store the parallel data RDI and FDI, and transfer the stored data to the core dies 112 through the through electrodes TSV, according to the write command WT.

The test register circuit 230 may perform a predetermined operation on the parallel data RDI and FDI outputted from the second alignment circuit 224 of the write circuit 220, and store the data, during the first test mode. The test register circuit 230 may transfer the stored data to a read path, i.e., the read register circuit 212 of the read circuit 210, in response to the read command RD, during the first test mode. In particular, the test register circuit 230 may include a plurality of storages (e.g., registers) for storing the data, and be implemented with a multiple input shift register or multiple input signature register (MISR) circuit. That is, when the first test mode signal TM_S1 is enabled, the test register circuit 230 may perform a predetermined operation on the parallel data RDI and FDI outputted from the second alignment circuit 224, and store the data. When the first test mode signal TM_S1 is enabled, the test register circuit 230 may transfer the stored data to the read register circuit 212, in response to the read command RD. Depending on an embodiment, the test register circuit 230 may output the stored data to the test device through an additional test output pad.

The data compression circuit 240 may generate a test output signal TOUT1 by compressing the parallel data RDO and FDO outputted from the read register circuit 212, and output the test output signal TOUT1 to the test device through the first test output pad TOUT_P1, during the first test mode. For example, when the first test mode signal TM_S1 is enabled, the data compression circuit 240 may perform a particular logical operation (e.g., an exclusive OR operation) on the parallel data RDO and FDO to generate the test output signal TOUT1 of 1-bit.

The timing control circuit 250 may receive a clock signal (i.e., a write strobe signal WDQS) inputted through the write strobe pad WDQS_P during a normal read operation, and generate the read timing signal R_STB<0:3> corresponding to the write strobe signal WDQS according to first to third output control signals OUTEN1 to OUTEN3. Further, the timing control circuit 250 may generate a read strobe signal RDQS according to the read timing signal R_STB<0:3>, and output the read strobe signal RDQS to the read strobe pad RDQS_P, during the normal read operation. The timing control circuit 250 may receive the write strobe signal WDQS inputted through the write strobe pad WDQS_P during a normal write operation, and generate the write timing signal W_STB<0:3> corresponding to the write strobe signal WDQS according to the first to third output control signals OUTEN1 to OUTEN3.

In general, the write strobe signal WDQS or the read strobe signal RDQS may be a waveform having an activation period prior to an input time point of data by a set time (e.g., a pre-amble), and having an activation period after an output time point of data by a set time (e.g., a post-amble). By using the write strobe signal WDQS or the read strobe signal RDQ having the pre-amble and the post-amble, a device for receiving the data may secure a sufficient data margin. The base logic die 114 may include a decoding circuit for decoding an input command. For example, when the read command RD is inputted, the decoding circuit may generate an output control signal OUTEN by decoding the read command RD. The output control signal OUTEN may be a signal for controlling the output time point of read data during the normal read operation, and be activated after a time corresponding to a read latency from an input time point of the read command RD has elapsed. The second output control signal OUTEN2 may correspond to the output control signal OUTEN, to be activated after the time corresponding to the read latency from when an input time point of the read command RD has elapsed. The first output control signal OUTEN1 may be a signal for controlling the pre-amble of the write strobe signal WDQS or the read strobe signal RDQ. The third output control signal OUTEN3 may be a signal for controlling the post-amble of the write strobe signal WDQS or the read strobe signal RDQ. The second and third output control signals OUTEN1 and OUTEN3 may be generated by advancing or delaying the second output control signal OUTEN2 by a set time.

The timing control circuit 250 may receive a test clock T_CK<0:3> of multiple phases through the test input pads TIN_P # during the first test mode, and generate the read timing signal R_STB<0:3> corresponding to the test clock T_CK<0:3> according to the first to third output control signals OUTEN1 to OUTEN3. At this time, the timing control circuit 250 may output the read timing signal R_STB<0:3> whose pre-amble and post-amble are removed, according to the first to third output control signals OUTEN1 to OUTEN3 during the first test mode. Further, the timing control circuit 250 may output the write timing signal W_STB<0:3> by delaying the read timing signal R_STB<0:3> by a preset time. For reference, FIG. 4 shows a case where the 4-phase test clock T_CK<0:3> is inputted to the timing control circuit 250. At this time, the four test input pads TIN_P1 to TIN_P4 may be provided to receive the 4-phase test clock T_CK<0:3>. However, the concept and spirit of the present invention are not limited thereto and the number of the test input pads TIN_P # may vary depending on the phases of the test clock.

The timing control circuit 250 may generate a test seed clock (S_CK of FIG. 5) using the test clock T_CK<0:3> of 4 phases inputted through the test input pads TIN_P # during the second test mode, and feed back the test seed clock S_CK as the write strobe signal WDQS through the write strobe pad WDQS_P. The timing control circuit 250 may generate a counting signal TOUT2<0:n> by counting the toggling number of the fed-back write strobe signal WDQS, and output the respective bits of the counting signal TOUT2<0:n> to the second test output pads TOUT_P2 #. For reference, FIG. 4 shows a case where the counting signal TOUT2<0:n> having (n+1) bits are generated. At this time, the (n+1) second test output pads TOUT_P20 to TOUT_P2n may be provided to output the respective bits of the counting signal TOUT2<0:n>.

The timing control circuit 250 may receive the test clock T_CK<0:3> of multiple phases through the test input pads TIN_P #, and generate the read timing signal R_STB<0:3> corresponding to the test clock T_CK<0:3> according to the first to third output control signals OUTEN1 to OUTEN3. At this time, the timing control circuit 250 may output the read timing signal R_STB<0:3> whose pre-amble and post-amble are removed, according to the first to third output control signals OUTEN1 to OUTEN3 during the third test mode. Further, the timing control circuit 250 may generate an internal strobe signal (IDQS of FIG. 5) based on the read timing signal R_STB<0:3>, and feed back the internal strobe signal IDQS as the read strobe signal RDQS through the read strobe pad RDQS_P. The timing control circuit 250 may generate the counting signal TOUT2<0:n> by counting the toggling number of the fed-back read strobe signal RDQS, and output the respective bits of the counting signal TOUT2<0:n> to the second test output pads TOUT_P2 #.

Figure 5:
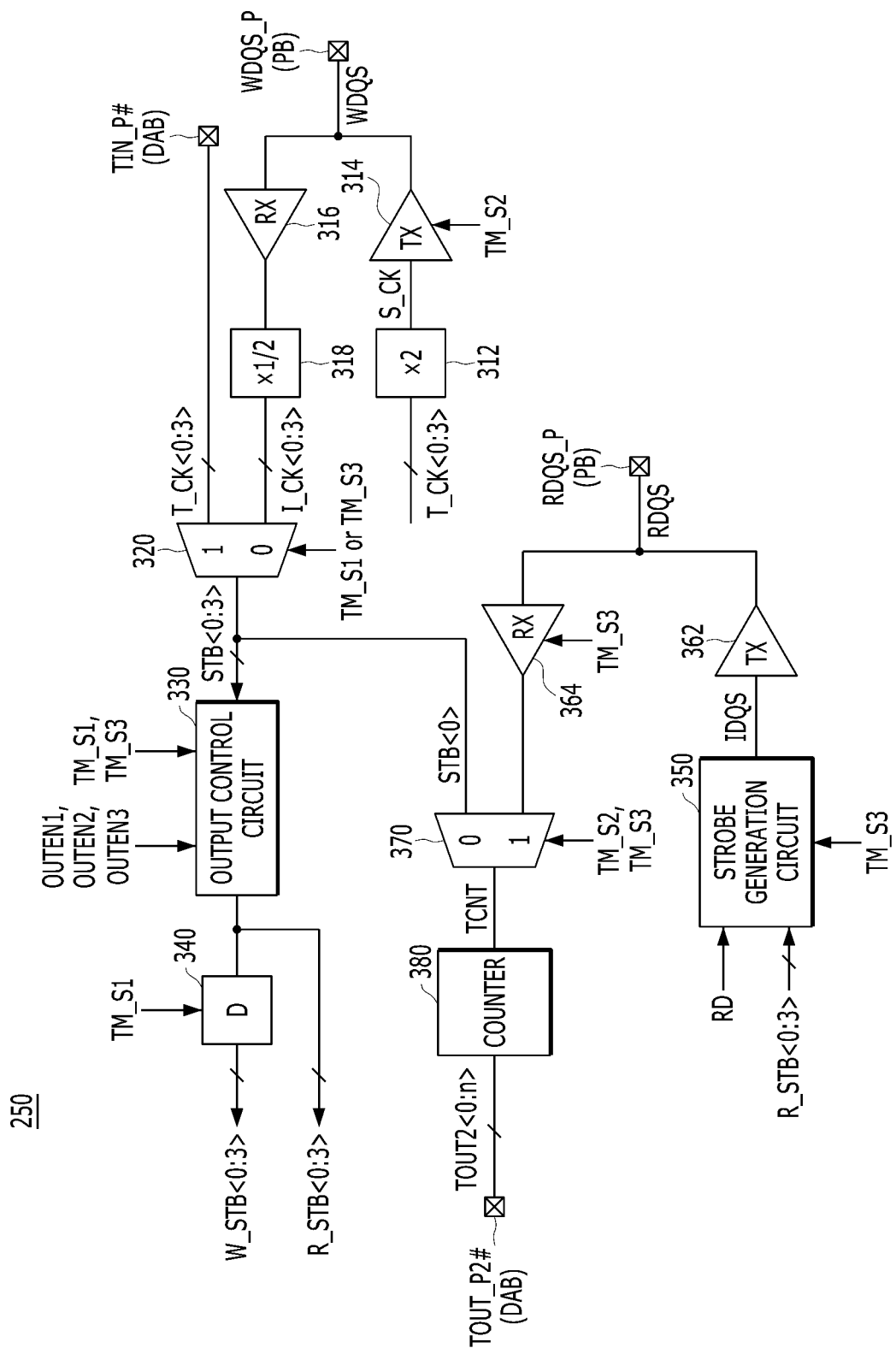
FIG. 5 is a circuit diagram illustrating a timing control circuit of FIG. 4, in accordance with an embodiment of the present disclosure.

FIG. 5 is a circuit diagram illustrating the timing control circuit 250 of FIG. 4, in accordance with an embodiment of the present disclosure.

Referring to FIG. 5, the timing control circuit 250 may include a clock multiplier 312, a first output circuit 314, a first input circuit 316, a clock divider 318, a first multiplexer 320, an output control circuit 330, a delay (D) 340, a strobe generation circuit 350, a second output circuit 362, a second input circuit 364, a second multiplexer 370, and a counter 380.

The clock multiplier 312 may multiply a frequency of the test clock T_CK<0:3> of 4 phases inputted through the test input pads TIN_P #, to thereby generate the test seed clock S_CK having a frequency higher than the test clock T_CK<0:3>. The clock multiplier 312 may generate the test seed clock S_CK that is activated according to the test clock T_CK<0> of first phase, deactivated according to the test clock T_CK<1> of second phase, activated according to the test clock T_CK<2> of third phase, and deactivated according to the test clock T_CK<3> of fourth phase. As a result, the test seed clock S_CK may have a frequency twice that of the test clock T_CK<0:3>.

For reference, when the specification of the stacked memory device 110 is revised to HBM 3.0, the write strobe signal WDQS that toggles with a predetermined period may be input through the write strobe pad WDQS_P even during the read operation, and an internal clock I_CK<0:3> may be generated based on the write strobe signal WDQS. The test clock T_CK<0:3> provided during the test operation has a lower frequency (e.g., 1/2) than the write strobe signal WDQS provided through the write strobe pad WDQS_P during a normal operation. Accordingly, in an embodiment of the present disclosure, a test operation on the write strobe pad WDQS_P may be performed in substantially the same environment (i.e., speed) as the normal operation by increasing the frequency of the test clock T_CK<0:3> using the clock multiplier 312.

The first output circuit 314 may output the test seed clock S_CK to the write strobe pad WDQS_P in response to the second test mode signal TM_S2. The first output circuit 314 may be activated in the second test mode. A signal inputted/outputted through the write strobe pad WDQS_P may be defined as the write strobe signal WDQS.

The first input circuit 316 may receive the write strobe signal WDQS transferred through the write strobe pad WDQS_P. That is, the first input circuit 316 may receive the write strobe signal WDQS transferred from the controller 120 through the write strobe pad WDQS_P, during the normal operation such as the normal read operation and/or the normal write operation. On the contrary, the first input circuit 316 may receive the write strobe signal WDQS fed back from the first output circuit 314 through the write strobe pad WDQS_P, during the second test mode.

The clock divider 318 may generate the internal clock I_CK<0:3> of 4 phases by dividing a frequency of the write strobe signal WDQS transferred from the first input circuit 316.

The first multiplexer 320 may output a seed timing signal STB<0:3> by selecting one of the test clock T_CK<0:3> of 4 phases provided through the test input pads TIN_P #, and the internal clock I_CK<0:3> provided from the clock divider 318, in response to the first test mode signal TM_S1 or the third test mode signal TM_S3. The first multiplexer 320 may select the test clock T_CK<0:3> to output the seed timing signal STB<0:3> when the first test mode signal TM_S1 or the third test mode signal TM_S3 is enabled. Otherwise, the first multiplexer 320 may select the internal clock I_CK<0:3> to output the seed timing signal STB<0:3>. For example, the first multiplexer 320 may select the internal clock I_CK<0:3> to output the seed timing signal STB<0:3> when the second test mode signal TM_S2 is enabled, or when the normal operation such as the normal read operation and the normal write operation is performed.

The output control circuit 330 may generate the read timing signal R_STB<0:3> corresponding to the seed timing signal STB<0:3> in response to the first to third output control signals OUTEN1 to OUTEN3, while selectively masking the first to third output control signals OUTEN1 to OUTEN3 in response to the first test mode signal TM_S1 or the third test mode signal TM_S3. For example, when the first test mode signal TM_S1 or the third test mode signal TM_S3 is enabled, the output control circuit 330 may mask the first output control signal OUTEN1 and the third output control signal OUTEN3, and may generate the read timing signal R_STB<0:3> whose pre-amble and post-amble are removed from the seed timing signal STB<0:3>, according to the masked output control signals. On the contrary, during the normal operation when both of the first test mode signal TM_S1 and the third test mode signal TM_S3 are disabled, the output control circuit 330 may generate the read timing signal R_STB<0:3> including the pre-amble and the post-amble of the seed timing signal STB<0:3>, according to the first to third output control signals OUTEN1 to OUTEN3, without masking the first to third output control signals OUTEN1 to OUTEN3. A detailed configuration of the output control circuit 330 is described in FIGS. 6 to 7B.

The delay 340 may output the write timing signal W_STB<0:3> by delaying the read timing signal R_STB<0:3> by a delay time amount (tD) according to the first test mode signal TM_S1. When the first test mode signal TM_S1 is enabled, the delay 340 may output the write timing signal W_STB<0:3> by delaying the read timing signal R_STB<0:3> by the delay time amount (tD). When the first test mode signal TM_S1 is disabled, the delay 340 may output the read timing signal R_STB<0:3> as the write timing signal W_STB<0:3> without delaying the read timing signal R_STB<0:3>. The delay time amount (tD) may be calculated in consideration of a time required for the read circuit 210 to output the read data DQ to the data pad DQ_P according to the read timing signal R_STB<0:3> and a time taken for the write circuit 220 to receive the write data DQ fed back through the data pad DQ_P. For example, the delay time amount (tD) may correspond to a delay time amount required by the first alignment circuit 214, the output circuit 216, the data pad DQ_P, the input circuit 226, and the second alignment circuit 224.

The strobe generation circuit 350 may generate the internal strobe signal IDQS based on the read timing signal R_STB<0:3> when the read command RD or the third test mode signal TM_S3 are enabled. For example, the strobe generation circuit 350 may generate the internal strobe signal IDQS that is activated in response to a first bit R_STB<0> of the read timing signal R_STB<0:3>, deactivated in response to a second bit R_STB<1>, activated in response to a third bit R_STB<2>, deactivated in response to a fourth bit R_STB<3>.

The second output circuit 362 may output the internal strobe signal IDQS to the read strobe pad RDQS_P. A signal inputted/outputted through the read strobe pad RDQS_P may be defined as the read strobe signal RDQS.

The second input circuit 364 may receive the read strobe signal RDQS transferred through the read strobe pad RDQS_P in response to the third test mode signal TM_S3.

The second multiplexer 370 may output a target counting signal TCNT by selecting one of the seed timing signal STB<0:3> provided from the first multiplexer 320, and the read strobe signal RDQS transferred through the second input circuit 364, in response to the second test mode signal TM_S2 and the third test mode signal TM_S3. The second multiplexer 370 may output the target counting signal TCNT by selecting a predetermined bit (e.g., a first bit STB<0>) of the seed timing signal STB<0:3>, when the second test mode signal TM_S2 is enabled. The second multiplexer 370 may output the target counting signal TCNT by selecting the read strobe signal RDQS when the third test mode signal TM_S3 is enabled.

The counter 380 may generate the counting signal TOUT2<0: n> by counting the toggling number of the target counting signal TCNT, and output the respective bits of the counting signal TOUT2<0:n> to the second test output pads TOUT_P2 #. Depending on an embodiment, a serializer for serializing the counting signal TOUT2<0:n> to generate a 1-bit serial signal may be provided at a rear end of the counter 380. In this case, one second test output pad TOUT_P2 for outputting a 1-bit serial signal may be provided.

Figure 6:
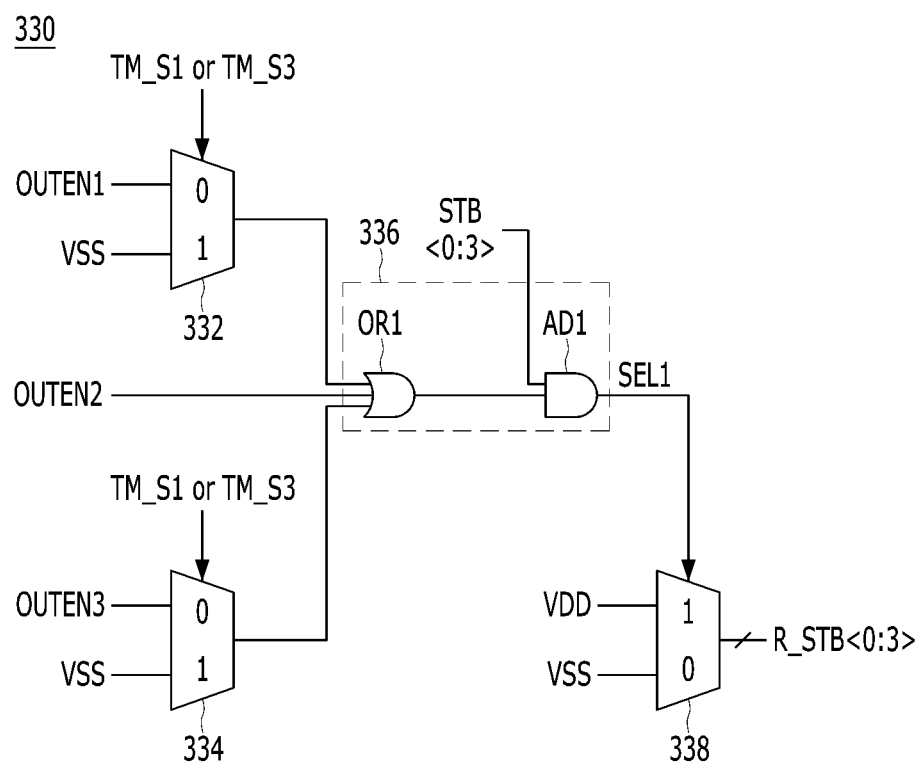
FIG. 6 is a circuit diagram illustrating an output control circuit of FIG. 4 in accordance with an embodiment of the present disclosure.
Figure 7A:
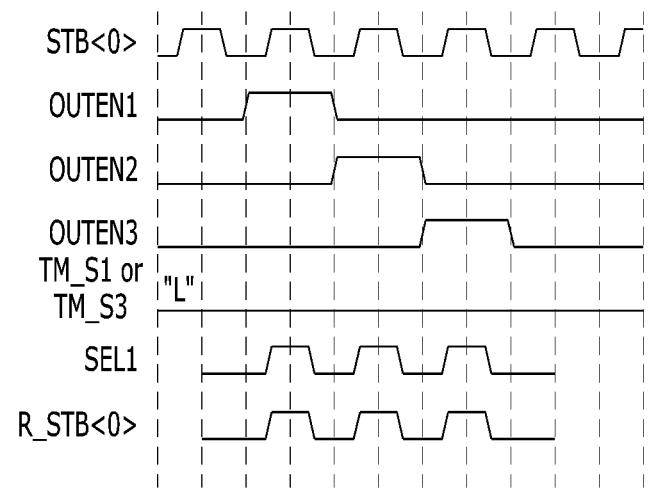
FIGS. 7A and 7B are waveform diagrams for describing an operation of the output control circuit of FIG. 6 in accordance with an embodiment of the present disclosure.
Figure 7B:
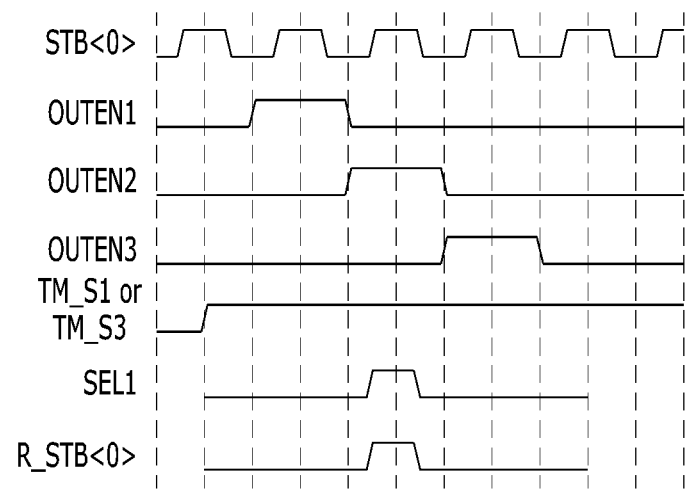

FIG. 6 is a circuit diagram illustrating the output control circuit 330 of FIG. 4 in accordance with an embodiment of the present disclosure. FIGS. 7A and 7B are waveform diagrams for describing an operation of the output control circuit 330 of FIG. 6 in accordance with an embodiment of the present disclosure.

Referring to FIG. 6, the output control circuit 330 may include first to third selection circuits 332, 334 and 338, and a filter circuit 336.

The first selection circuit 332 may select and output one of the first output control signal OUTEN1 and a ground level signal VSS in response to the first test mode signal TM_S1 or the third test mode signal TM_S3. The second selection circuit 334 may select and output one of the third output control signal OUTEN3 and the ground level signal VSS in response to the first test mode signal TM_S1 or the third test mode signal TM_S3. The first and second selection circuits 332 and 334 may select and output the ground level signal VSS when any of the first test mode signal TM_S1 and the third test mode signal TM_S3 is enabled.

The filter circuit 336 may generate a selection signal SEL1 by filtering a section of the seed timing signal STB<0:3> according to the second output control signal OUTEN2, and output signals of the first and second selection circuits 332 and 334. For example, the filter circuit 336 may include an OR gate OR1 and an AND gate AD1. The OR gate OR1 may perform a logic OR operation on the second output control signal OUTEN2, and the output signals of the first and second selection circuits 332 and 334. The AND gate AD1 may perform a logic AND operation on an output of the OR gate OR1 and the seed timing signal STB<0:3>, and output the selection signal SEL1.

The third selection circuit 338 may output the read timing signal R_STB<0:3> by selecting one of a source level signal VDD and the ground level signal VSS in response to the selection signal SEL1. The third selection circuit 338 may select the source level signal VDD when the selection signal SEL1 is enabled, and may select the ground level signal VSS when the selection signal SEL1 is disabled.

Referring to FIG. 7A, an operation of the output control circuit 330 during the normal read operation is shown. In FIG. 7A, one bit of the seed timing signal STB<0:3> and one bit of the read timing signal R_STB<0:3> are shown.

During the read operation, the first to third output control signals OUTEN1 to OUTEN3 which are sequentially enabled according to the read command RD, are generated.

When both of the first test mode signal TM_S1 and the third test mode signal TM_S3 are disabled, the first selection circuit 332 may select and output the first output control signal OUTEN1, and the second selection circuit 334 may select and output the third output control signal OUTEN3.

The filter circuit 336 may generate the selection signal SEL1 by filtering the seed timing signal STB<0:3> according to the first to third output control signals OUTEN1 to OUTEN. The third selection circuit 338 may output the read timing signal R_STB<0:3> by selecting the source level signal VDD when the selection signal SEL1 is enabled to a logic high level, and may select the ground level signal VSS when the selection signal SEL1 is disabled to a logic low level.

Accordingly, during the normal read operation, the output control circuit 330 may generate the read timing signal R_STB<0:3> including the pre-amble and the post-amble of the seed timing signal STB<0:3>.

Referring to FIG. 7B, an operation of the output control circuit 330 during the first test mode or the third test mode is shown. In FIG. 7B, one bit of the seed timing signal STB<0:3> and one bit of the read timing signal R_STB<0: 3> are shown.

During the first test mode or the third test mode, the first to third output control signals OUTEN1 to OUTEN3 which are sequentially enabled according to the read command RD, are generated.

When the first test mode signal TM_S1 or the third test mode signal TM_S3 are enabled, the first selection circuit 332 and the second selection circuit 334 may select and output the ground level signal VSS. The filter circuit 336 may generate the selection signal SEL1 by filtering the seed timing signal STB<0:3> according to the second output control signal OUTEN2 and the ground level signal VSS. The third selection circuit 338 may output the read timing signal R_STB<0:3> by selecting the source level signal VDD when the selection signal SEL1 is enabled to a logic high level, and may select the ground level signal VSS when the selection signal SEL1 is disabled to a logic low level.

Accordingly, during the first test mode or the third test mode, the output control circuit 330 may generate the read timing signal R_STB<0:3> excluding the pre-amble and the post-amble of the seed timing signal STB<0:3>.

Hereinafter, referring to FIGS. 4 to 12, a normal operation and a test operation of the stacked memory device 110 will be described in detail.

Figure 8A:
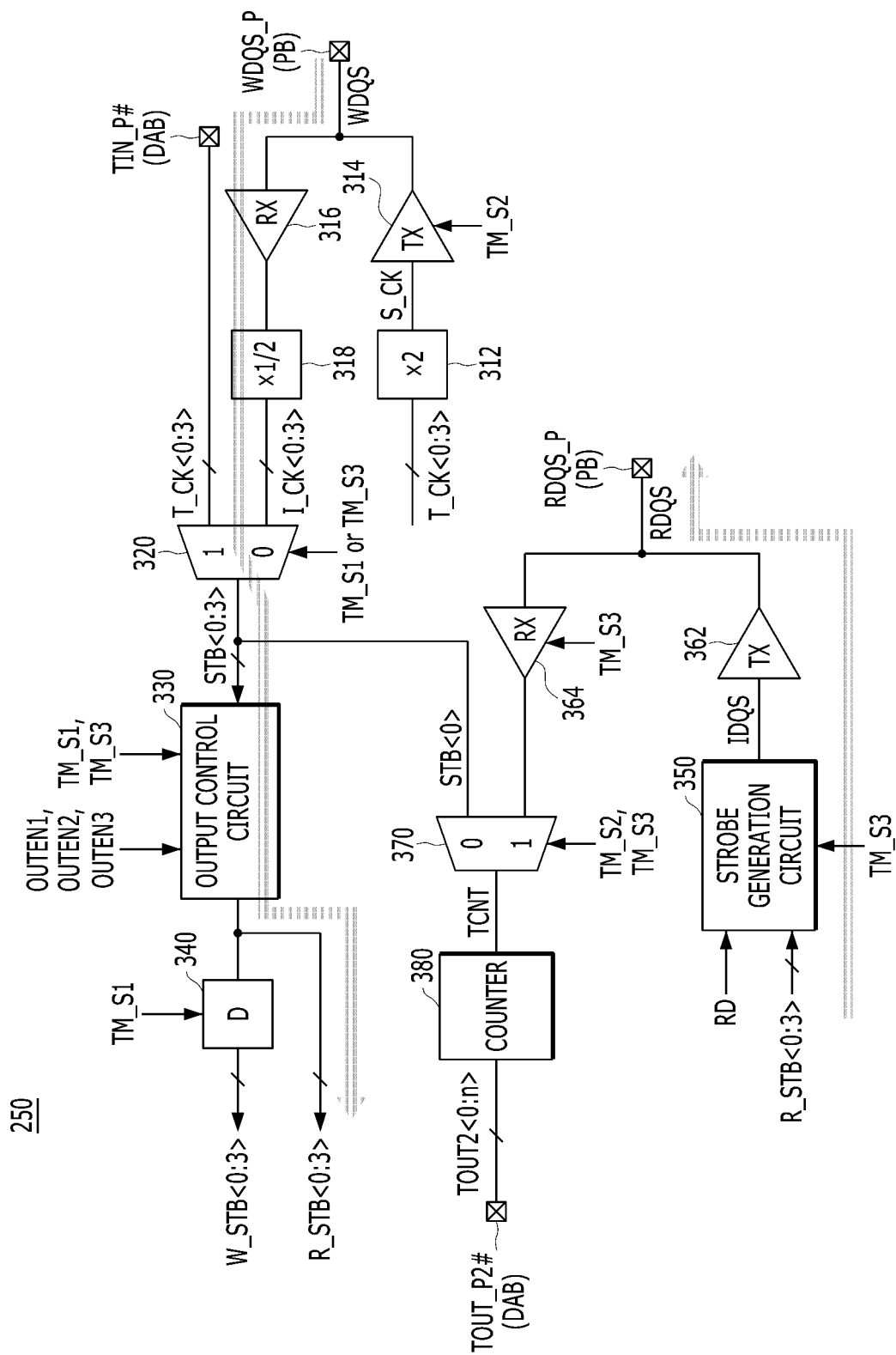
FIGS. 8A and 8B are circuit diagrams for describing a flow of read and write strobe signals during a normal operation in accordance with an embodiment of the present disclosure.
Figure 8B:
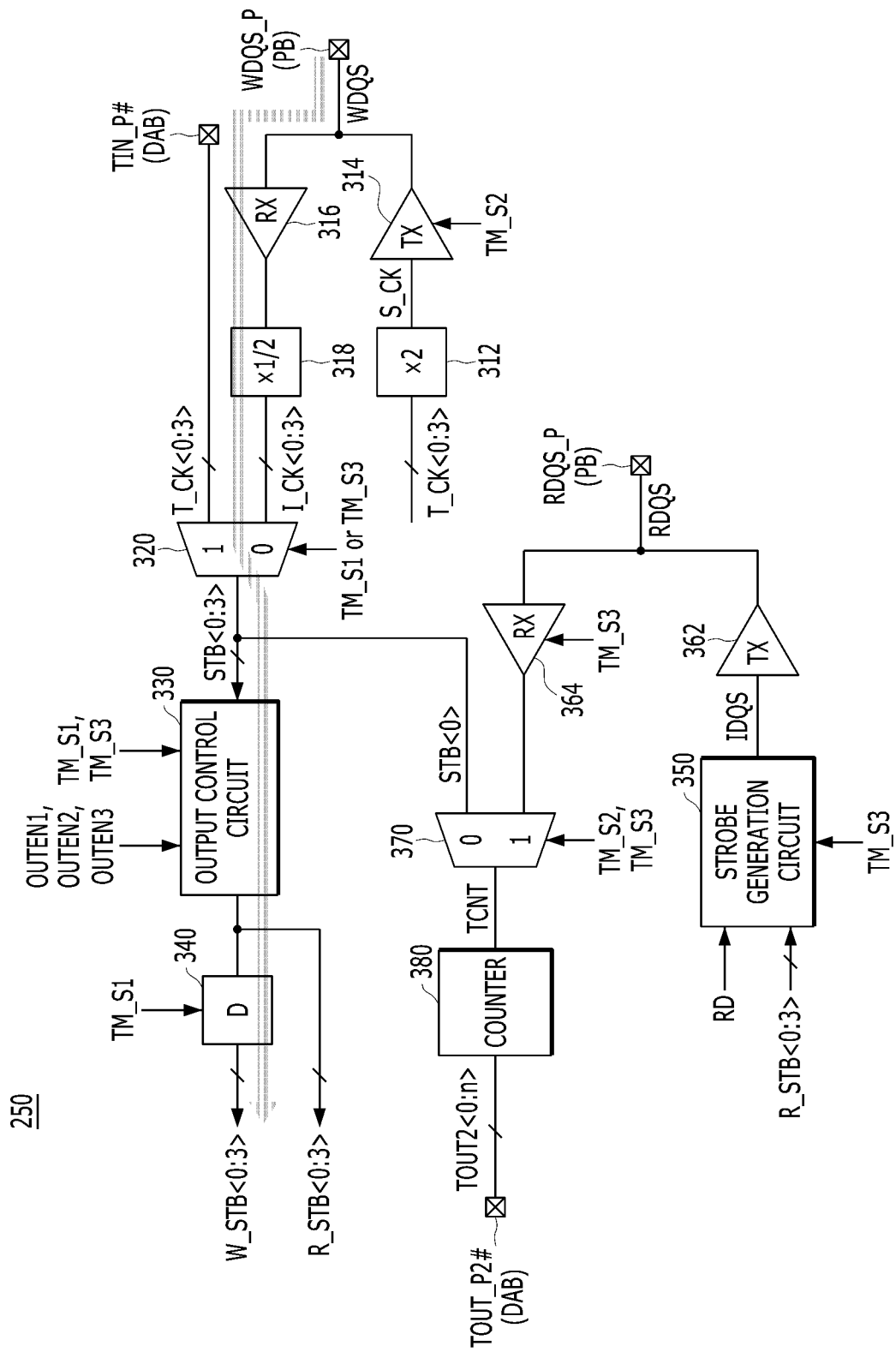

FIGS. 8A and 8B are circuit diagrams for describing a flow of the read strobe signal RDQS and the write strobe signal WDQS during the normal operation in accordance with an embodiment of the present disclosure.

Referring to FIG. 8A, during the normal read operation, the write strobe signal WDQS may be inputted through the write strobe pad WDQS_P from the controller 120. The first input circuit 316 may receive the write strobe signal WDQS transferred through the write strobe pad WDQS_P, and the clock divider 318 may generate the internal clock I_CK<0: 3> of 4 phases by dividing a frequency of the write strobe signal WDQS. The first multiplexer 320 may output the seed timing signal STB<0:3> by selecting the internal clock I_CK<0:3> provided from the clock divider 318. As described in FIG. 7A, the output control circuit 330 may generate the read timing signal R_STB<0:3> including the pre-amble and the post-amble of the seed timing signal STB<0:3>, according to the first to third output control signals OUTEN1 to OUTEN.

Accordingly, the read circuit 210 of FIG. 4 may output the read data transmitted through the through-electrodes TSV from the core dies 112, to the data pads DQ_P according to the read timing signal R_STB<0:3>. Further, the strobe generation circuit 350 may generate the internal strobe signal IDQS based on the read timing signal R_STB<0:3>, and the second output circuit 362 may output the internal strobe signal IDQS to the read strobe pad RDQS_P.

As described above, during the normal read operation, the read timing signal R_STB<0:3> may be generated based on the write strobe signal WDQS provided through the write strobe pad WDQS_P from the controller 120.

Referring to FIG. 8B, during the normal write operation, the write strobe signal WDQS may be inputted through the write strobe pad WDQS_P from the controller 120. Likewise, the seed timing signal STB<0:3> may be outputted through the first input circuit 316, the clock divider 318, and the first multiplexer 320. The output control circuit 330 may generate the read timing signal R_STB<0:3> including the pre-amble and the post-amble of the seed timing signal STB<0:3>, according to the first to third output control signals OUTEN1 to OUTEN3. The delay 340 may output the write timing signal W_STB<0:3> without delaying the read timing signal R_STB<0:3>.

Accordingly, the write circuit 220 of FIG. 4 may transfer the write data transferred through the data pad DQ_P from the controller 120, to the core dies 112 through the through-electrodes TSV, according to the write timing signal W_STB<0:3>.

Figure 9:
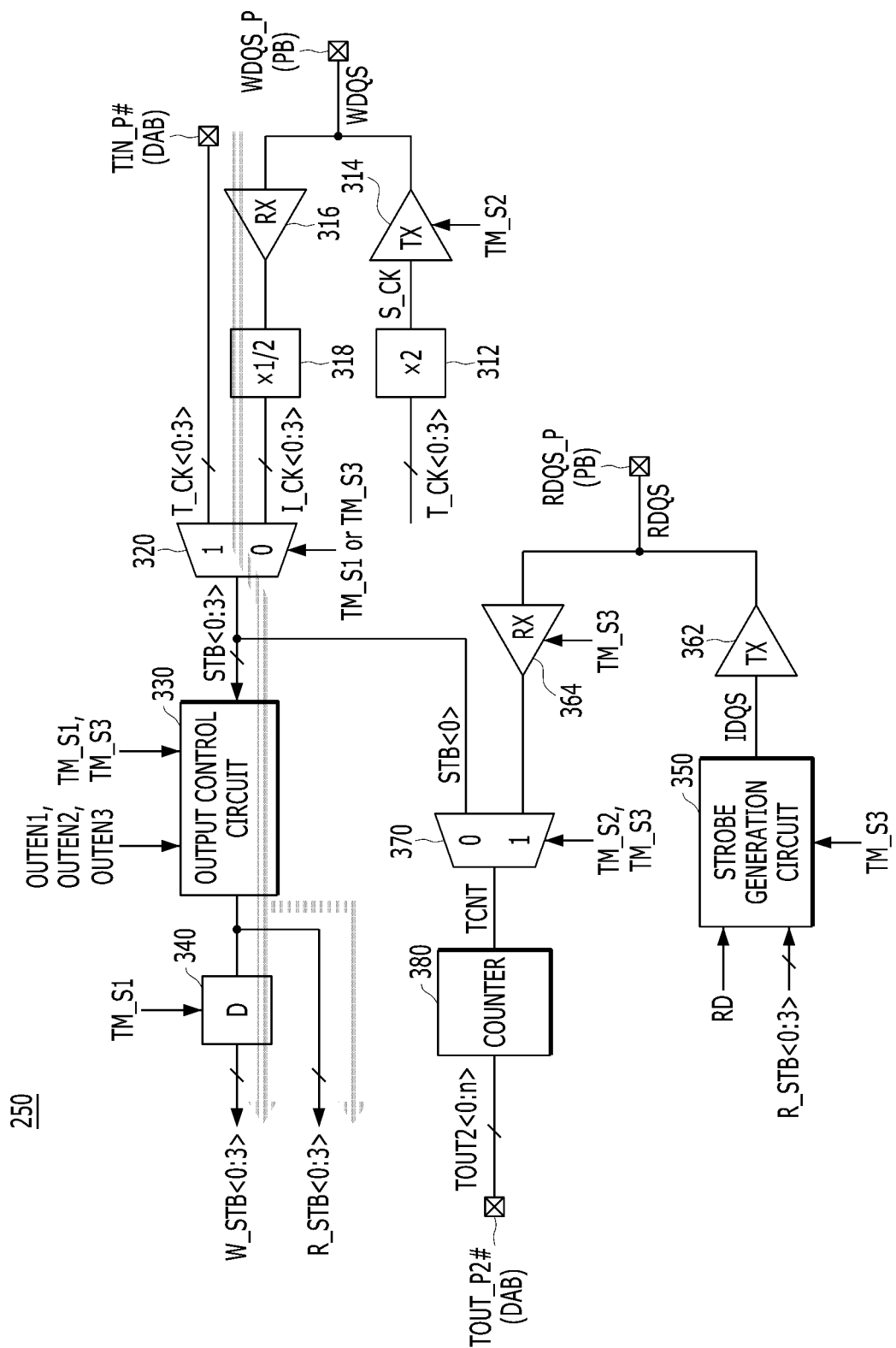
FIG. 9 is a circuit diagram for describing a flow of read and write strobe signals during a first test mode in accordance with an embodiment of the present disclosure.
Figure 10:
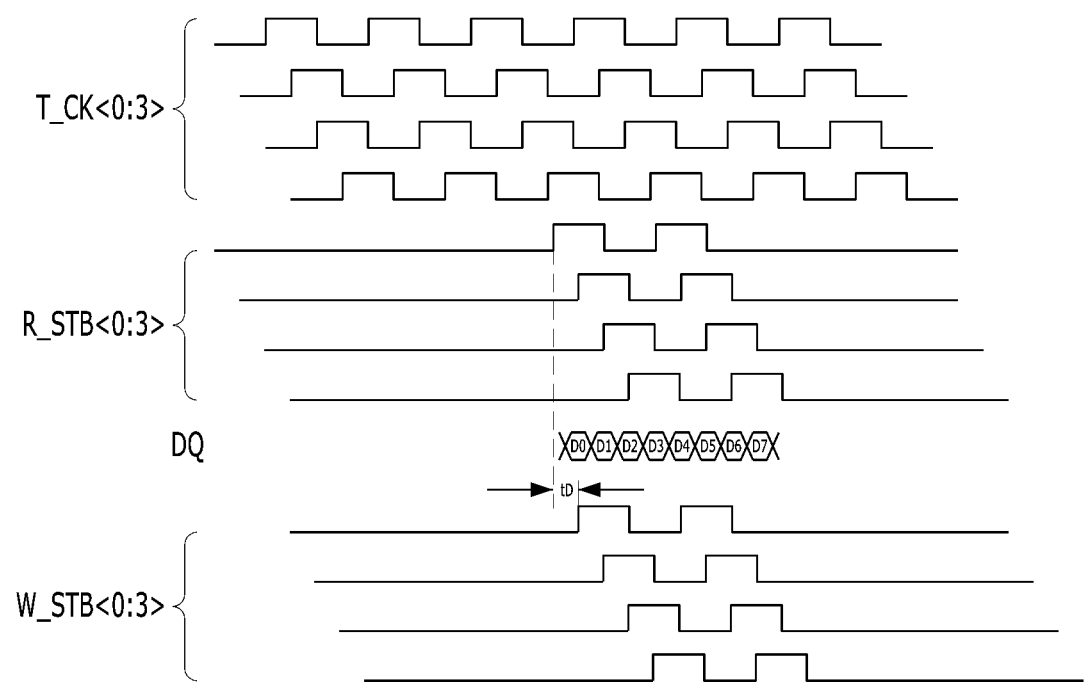
FIG. 10 is a waveform diagram for describing the flow of read and write strobe signals during the first test mode of FIG. 9 in accordance with an embodiment of the present disclosure.

FIG. 9 is a circuit diagram for describing a flow of the read strobe signal RDQS and the write strobe signal WDQS during the first test mode in accordance with an embodiment of the present disclosure. FIG. 10 is a waveform diagram for describing the flow of the read strobe signal RDQS and the write strobe signal WDQS during the first test mode of FIG. 9 in accordance with an embodiment of the present disclosure.

Referring to FIG. 9, the first test mode signal TM_S1 is enabled in the first test mode.

The first multiplexer 320 may select the test clock T_CK<0:3> of 4 phases provided through the test input pads TIN_P #, to output the seed timing signal STB<0:3>. Referring to FIG. 10, the output control circuit 330 may generate the read timing signal R_STB<0:3> excluding the pre-amble and the post-amble of the seed timing signal STB<0:3>, according to the first to third output control signals OUTEN1 to OUTEN3, as described in FIG. 7B.

In response to the read command RD, the test register circuit 230 of FIG. 4 may provide a stored initial data to the read register circuit 212 of the read circuit 210. The read register circuit 212 may store the test data transmitted from the test register circuit 230. The first alignment circuit 214 may serialize the parallel data RDO and FDO, which are outputted from the read register circuit 212, based on the read timing signal R_STB<0:3>. The output circuit 216 may output the serialized data through the data pad DQ_P as the read data DQ.

Referring to FIGS. 9 and 10, the delay 340 may output the write timing signal W_STB<0:3> by delaying the read timing signal R_STB<0:3> by the delay time amount (tD).

The input circuit 226 of the write circuit 220 in FIG. 4 may receive the write data DQ fed back through the data pad DQ_P. The second alignment circuit 224 may align data outputted from the input circuit 226, in parallel, based on the write timing signal W_STB<0:3>, to output the parallel data RDI and FDI. The test register circuit 230 may perform a predetermined operation on the parallel data RDI and FDI, and store the data.

In response to the read command, the test register circuit 230 may provide the stored data to the read register circuit 212 of the read circuit 210. The read register circuit 212 may store the test data transmitted from the test register circuit 230. The data compression circuit 240 may generate the test output signal TOUT1 by compressing the parallel data RDO and FDO outputted from the read register circuit 212, and output the test output signal TOUT1 to the test device through the first test output pad TOUT_P1. The test device may verify the read circuit 210, the write circuit 220 and the data pad DQ_P based on the test output signal TOUT1.

As described above, whenever the read command RD is inputted in a state that the first test mode signal TM_S1 is enabled, the test data stored in the test register circuit 230 may be repeatedly output as the read data DQ through the data pad DQ_P, and then fed back to perform the above test operation. Accordingly, the test device may test the circuits on the read/write path of the memory device using the limited test pad TOUT_P1.

Figure 11:
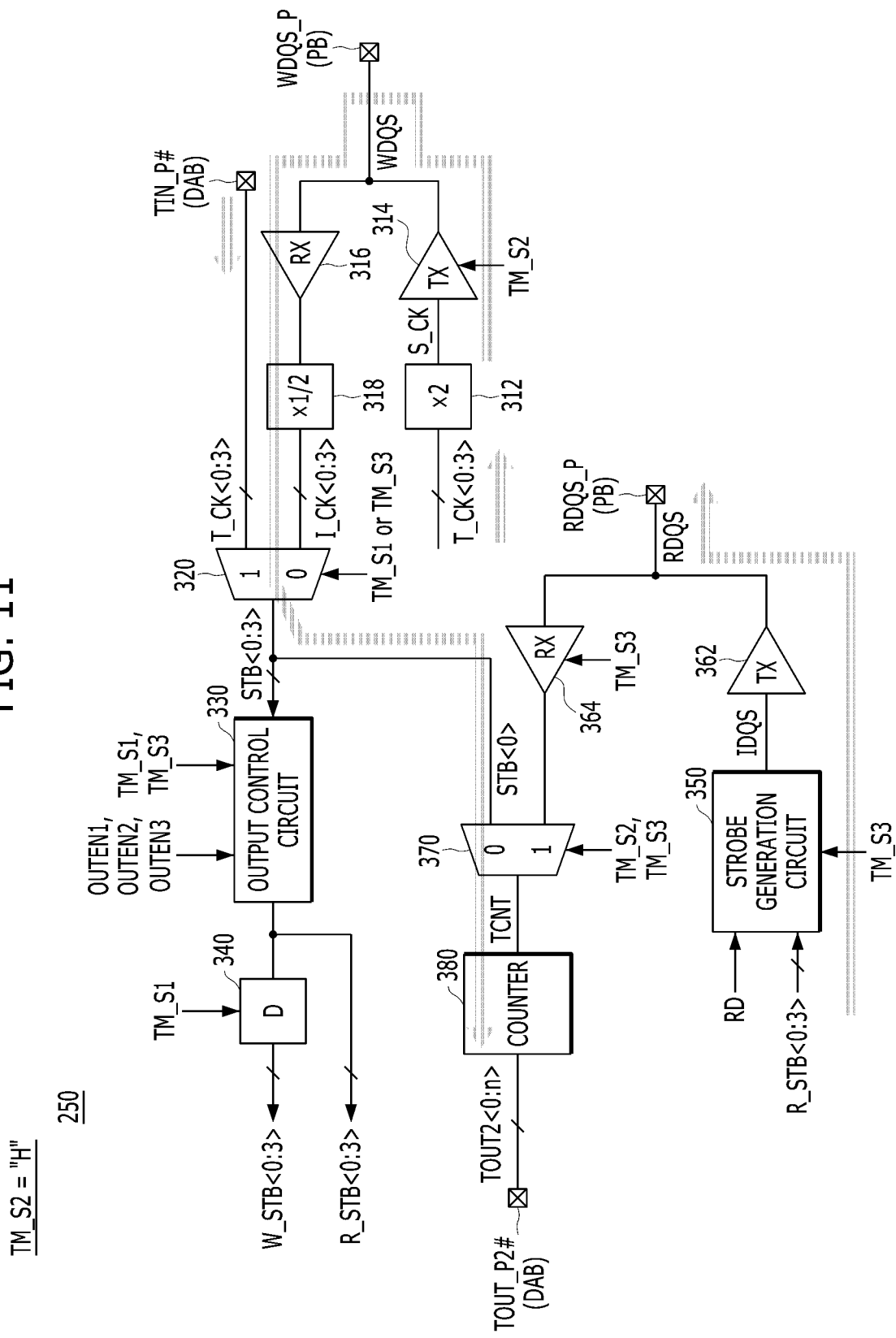
FIG. 11 is a circuit diagram for describing a flow of a write strobe signal during a second test mode in accordance with an embodiment of the present disclosure.

FIG. 11 is a circuit diagram for describing a flow of the write strobe signal WDQS during the second test mode in accordance with an embodiment of the present disclosure.

Referring to FIG. 11, the second test mode signal TM_S2 is enabled in the second test mode.

The clock multiplier 312 may multiply a frequency of the test clock T_CK<0:3> of 4 phases inputted through the test input pads TIN_P #, to thereby generate the test seed clock S_CK having a frequency higher than the test clock T_CK<0:3>. The first output circuit 314 may output the test seed clock S_CK as the write strobe signal WDQS to the write strobe pad WDQS_P.

The first input circuit 316 may feed back the write strobe signal WDQS transferred through the write strobe pad WDQS_P. The clock divider 318 may generate the internal clock I_CK<0:3> of 4 phases by dividing a frequency of the write strobe signal WDQS transferred from the first input circuit 316. The first multiplexer 320 may select the internal clock I_CK<0:3> to output the seed timing signal STB<0:3>.

The second multiplexer 370 may output the target counting signal TCNT by selecting the first bit STB<0> of the seed timing signal STB<0:3>. The counter 380 may generate the counting signal TOUT2<0:n> by counting the toggling number of the target counting signal TCNT, and output the respective bits of the counting signal TOUT2<0:n> to the test device through the second test output pads TOUT_P2 #. The test device may verify the first input circuit 316, the clock divider 318, and the write strobe pad WDQS_P, based on the counting signal TOUT2<0:n>.

Figure 12:
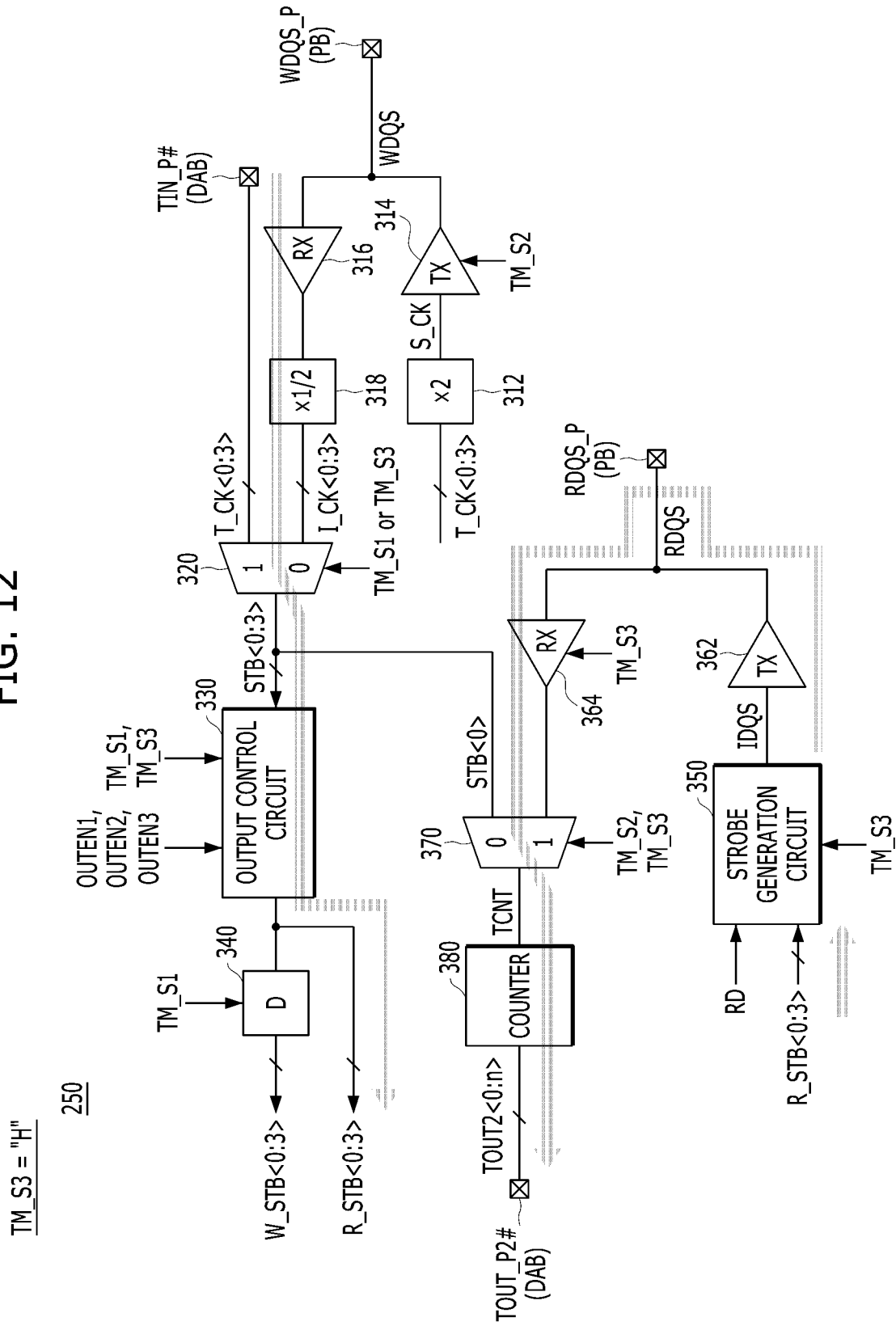
FIG. 12 is a circuit diagram for describing a flow of a read strobe signal during a third test mode in accordance with an embodiment of the present disclosure.

FIG. 12 is a circuit diagram for describing a flow of the read strobe signal RDQS during the third test mode in accordance with an embodiment of the present disclosure.

Referring to FIG. 12, the third test mode signal TM_S3 is enabled in the third test mode.

The first multiplexer 320 may select the test clock T_CK<0:3> of 4 phases provided through the test input pads TIN_P #, to output the seed timing signal STB<0:3>. As described in FIG. 7B, the output control circuit 330 may generate the read timing signal R_STB<0:3> excluding the pre-amble and the post-amble of the seed timing signal STB<0:3>, according to the first to third output control signals OUTEN1 to OUTEN3.

The strobe generation circuit 350 may generate the internal strobe signal IDQS based on the read timing signal R_STB<0:3>, and the second output circuit 362 may output the internal strobe signal IDQS as the read strobe signal RDQS through the read strobe pad RDQS_P. The second input circuit 364 may receive the read strobe signal RDQS fed back through the read strobe pad RDQS_P.

The second multiplexer 370 may output the target counting signal TCNT by selecting the read strobe signal RDQS. The counter 380 may generate the counting signal TOUT2<0:n> by counting the toggling number of the target counting signal TCNT, and output the respective bits of the counting signal TOUT2<0:n> to the test device through the second test output pads TOUT_P2 #. The test device may verify the strobe generation circuit 350, the second output circuit 362, and the read strobe pad RDQS_P, based on the counting signal TOUT2<0:n>.

As described above, in accordance with an embodiment of the present disclosure, a new method of testing the read/write circuits 210 and 220 on the read/write path, the data pads DQ_P, the write strobe pad WDQS_P, and the read strobe pad RDQS_P when the specification changes, is provided. Thus, the test operation scalability of the memory device may be improved.

As noted in the above embodiment, in the second test mode, the output control circuit 330 generates the read timing signal R_STB<0:3> from which both of the pre-amble and the post-amble are removed from the seed timing signal STB<0:3>, but the present invention is not limited thereto. In the following embodiment, a method of generating a read timing signal R_STB<0:3> from which the pre-amble or the post-amble is selectively removed from the seed timing signal STB<0:3>, will be described.

Figure 13:
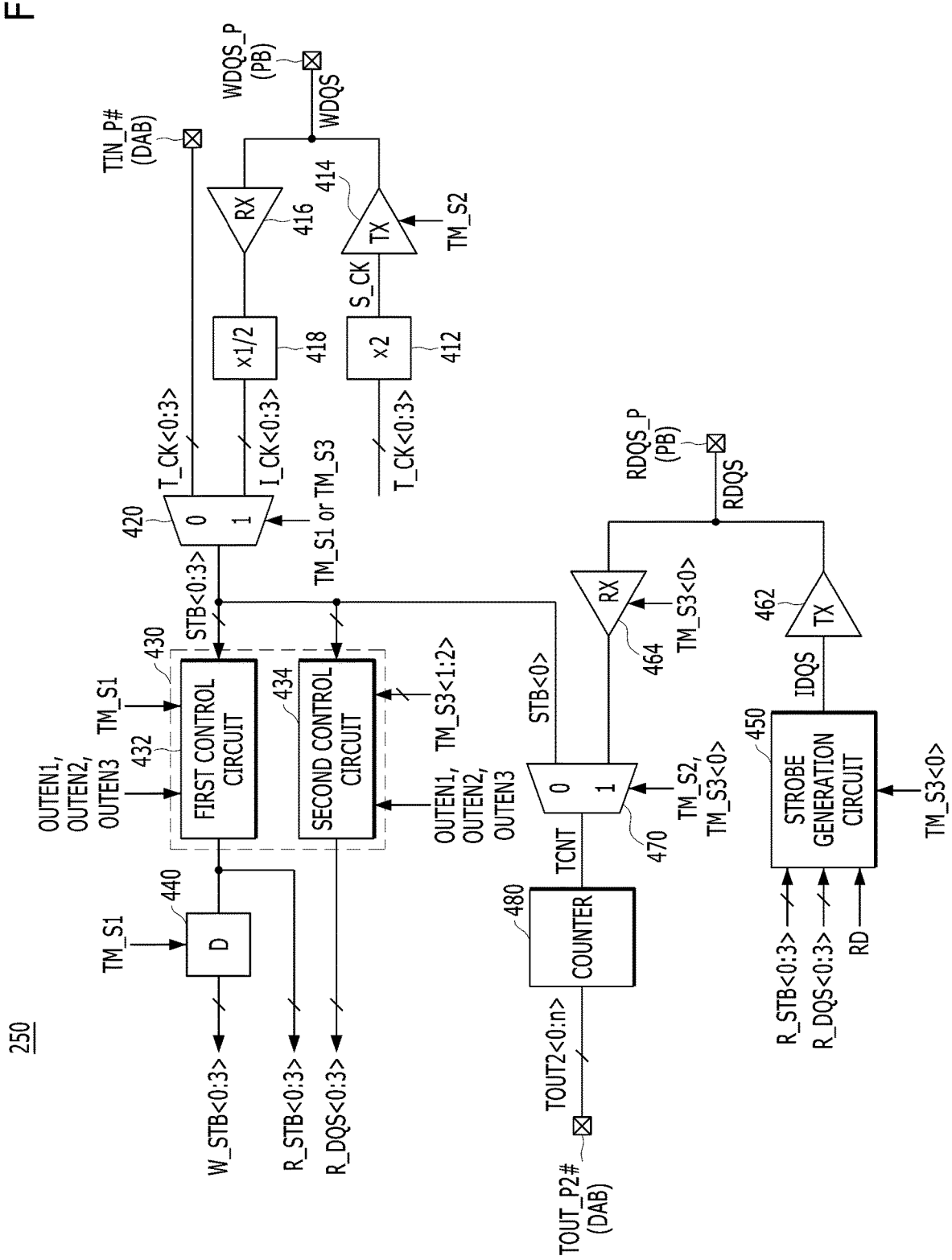
FIG. 13 is a circuit diagram illustrating a timing control circuit of FIG. 4, in accordance with another embodiment of the present disclosure.
Figure 14:
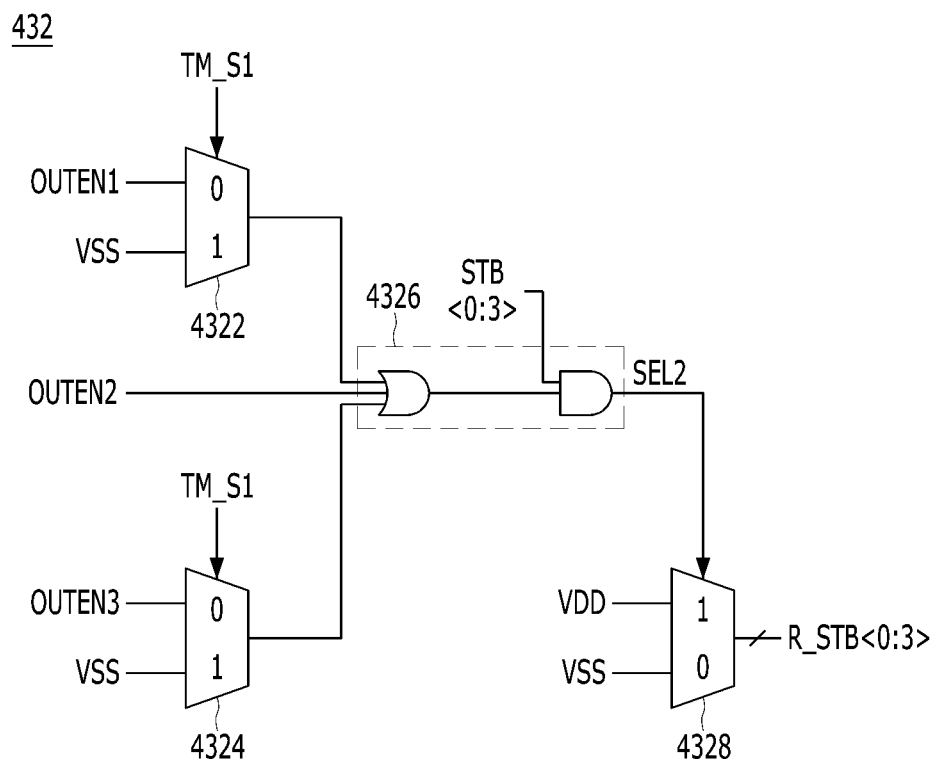
FIG. 14 is a circuit diagram illustrating a first control circuit of FIG. 13 in accordance with an embodiment of the present disclosure.
Figure 15:
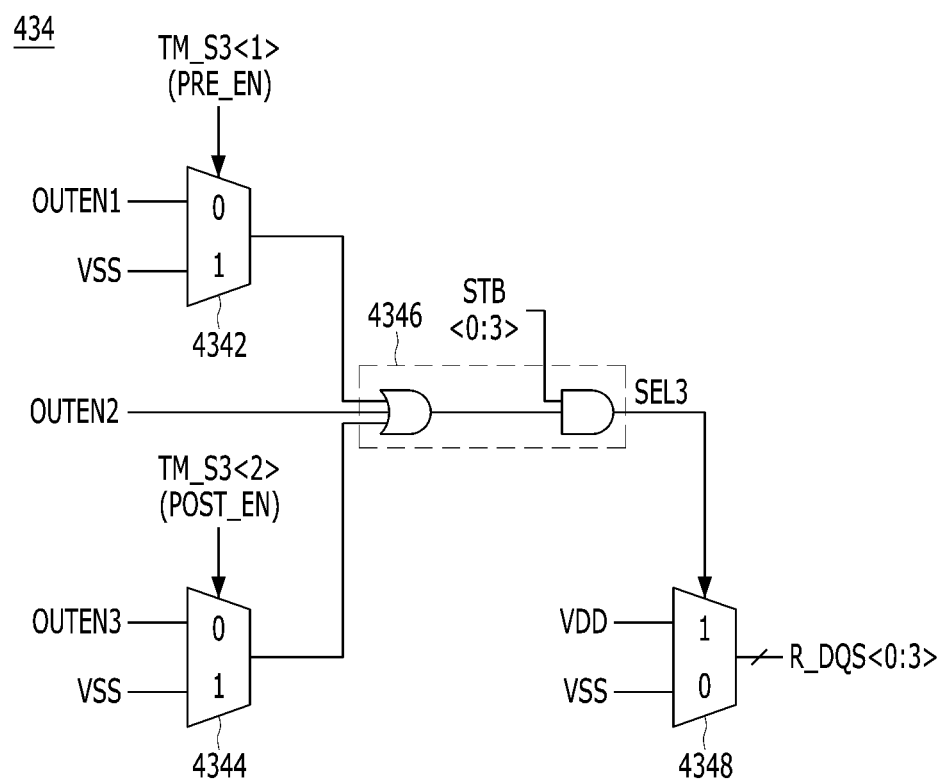
FIG. 15 is a circuit diagram illustrating a second control circuit of FIG. 13 in accordance with an embodiment of the present disclosure.

FIG. 13 is a circuit diagram illustrating the timing control circuit 250 of FIG. 4, in accordance with an embodiment of the present disclosure. FIG. 14 is a circuit diagram illustrating a first control circuit 432 of FIG. 13 in accordance with an embodiment of the present disclosure. FIG. 15 is a circuit diagram illustrating a second control circuit 434 of FIG. 13 in accordance with an embodiment of the present disclosure.

Referring to FIG. 13, the timing control circuit 250 may include a clock multiplier 412, a first output circuit 414, a first input circuit 416, a clock divider 418, a first multiplexer 420, an output control circuit 430, a delay (D) 440, a strobe generation circuit 450, a second output circuit 462, a second input circuit 464, a second multiplexer 470, and a counter 480.

Different from the timing control circuit 250 of FIG. 5, the timing control circuit 250 of FIG. 13 may receive a third test mode signal TM_S3<0:2> of multiple bits. For example, in case of the third test mode signal TM_S3<0:2> of 3 bits, a first bit TM_S3<0> of the third test mode signal TM_S3<0:2> may be used as a signal indicating entry of a third test mode, and may be the same signal as the third test mode signal TM_S3 of FIG. 5. A second bit TM_S3<1> of the third test mode signal TM_S3<0:2> may be a signal for selecting whether to remove a pre-amble and may be defined as a pre-amble control signal (PRE_EN of FIG. 15), and a third bit TM_S3<2> of the third test mode signal TM_S3<0:2> may be a signal for selecting whether to remove a postamble and may be defined as a post-amble control signal (POST_EN of FIG. 15).

The clock multiplier 412, the first output circuit 414, the first input circuit 416, the clock divider 418, the first multiplexer 420, the delay 440, the second output circuit 462, the second input circuit 464, the second multiplexer 470, and the counter 480 of FIG. 13 may have substantially the same configuration and operation as those of FIG. 5.

The output control circuit 430 may include the first control circuit 432 and the second control circuit 434.

The first control circuit 432 may generate a read timing signal R_STB<0:3> corresponding to a seed timing signal STB<0:3> in response to first to third output control signals OUTEN1 to OUTEN3, while selectively masking the first to third output control signals OUTEN1 to OUTEN3 according to a first test mode signal TM_S1. For example, when the first test mode signal TM_S1 is enabled, the first control circuit 432 may mask the first output control signal OUTEN1 and the third output control signal OUTEN3, and may generate the read timing signal R_STB<0:3> whose pre-amble and post-amble are removed from the seed timing signal STB<0:3>, according to the masked output control signals. On the contrary, when the first test mode signal TM_S1 is disabled, e.g., during a normal operation, the first control circuit 432 may generate the read timing signal R_STB<0:3> including the pre-amble and the post-amble of the seed timing signal STB<0:3>, according to the first to third output control signals OUTEN1 to OUTEN3, without masking the first to third output control signals OUTEN1 to OUTEN3.

Referring to FIG. 14, the first control circuit 432 may include first to third selection circuits 4322, 4324 and 4328, and a filter circuit 4326.

The first selection circuit 4322 may select and output one of the first output control signal OUTEN1 and a ground level signal VSS in response to the first test mode signal TM_S1. The second selection circuit 4324 may select and output one of the third output control signal OUTEN3 and the ground level signal VSS in response to the first test mode signal TM_S1. The first and second selection circuits 4322 and 4324 may select and output the ground level signal VSS when the first test mode signal TM_S1 is enabled.

The filter circuit 4326 may generate a selection signal SEL2 by filtering a section of the seed timing signal STB<0:3> according to the second output control signal OUTEN2, and output signals of the first and second selection circuits 4322 and 4324. For example, the filter circuit 4326 may include an OR gate and an AND gate.

The third selection circuit 4328 may output the read timing signal R_STB<0:3> by selecting one of a source level signal VDD and the ground level signal VSS in response to the selection signal SEL2. The third selection circuit 4328 may select the source level signal VDD when the selection signal SEL2 is enabled, and may select the ground level signal VSS when the selection signal SEL2 is disabled.

An operation of the first control circuit 432 may be substantially the same as the operation of the output control circuit 330 of FIGS. 7A and 7B.

Referring back to FIG. 13, the second control circuit 434 may generate a test timing signal R_DQS<0:3> corresponding to the seed timing signal STB<0:3> in response to the first to third output control signals OUTEN1 to OUTEN3, while selectively masking the first to third output control signals OUTEN1 to OUTEN3 according to the second and third bits TM_S3<1> and TM_S3<2> of the third test mode signal TM_S3<0:2>, i.e., the pre-amble control signal PRE_EN and the post-amble control signal POST_EN. For example, the second control circuit 434 may mask the first output control signal OUTEN1 when the pre-amble control signal PRE_EN is enabled, and mask the third output control signal OUTEN3 when the post-amble control signal POST_EN is enabled. The second control circuit 434 may generate the test timing signal R_DQS<0:3> whose pre-amble or post-amble is removed from the seed timing signal STB<0:3>, according to the masked output control signals.

Referring to FIG. 15, the second control circuit 434 may include first to third selection circuits 4342, 4344 and 4348, and a filter circuit 4346.

The first selection circuit 4342 may select and output one of the first output control signal OUTEN1 and a ground level signal VSS in response to the pre-amble control signal PRE_EN. The first selection circuits 4342 may select and output the ground level signal VSS when the pre-amble control signal PRE_EN is enabled.

The second selection circuit 4344 may select and output one of the third output control signal OUTEN3 and the ground level signal VSS in response to the post-amble control signal POST_EN. The second selection circuits 4344 may select and output the ground level signal VSS when the post-amble control signal POST_EN is enabled.

The filter circuit 4346 may generate a selection signal SEL3 by filtering a section of the seed timing signal STB<0:3> according to the second output control signal OUTEN2, and output signals of the first and second selection circuits 4342 and 4344. For example, the filter circuit 4346 may include an OR gate and an AND gate.

The third selection circuit 4348 may output the test timing signal R_DQS<0:3> by selecting one of a source level signal VDD and the ground level signal VSS in response to the selection signal SEL3. The third selection circuit 4348 may select the source level signal VDD when the selection signal SEL3 is enabled, and may select the ground level signal VSS when the selection signal SEL3 is disabled.

Referring back to FIG. 13, the strobe generation circuit 450 may select one of the read timing signal R_STB<0:3> and the test timing signal R_DQS<0:3> according to a read command RD and the first bit TM_S3<0> of the third test mode signal TM_S3<0:2>, and generate an internal strobe signal IDQS based on the selected signal. When the read command RD is inputted, the strobe generation circuit 450 may generate the internal strobe signal IDQS based on the read timing signal R_STB<0:3>. For example, the strobe generation circuit 450 may generate the internal strobe signal IDQS that is activated in response to a first bit R_STB<0> of the read timing signal R_STB<0:3>, deactivated in response to a second bit R_STB<1>, activated in response to a third bit R_STB<2>, deactivated in response to a fourth bit R_STB<3>. When the first bit TM_S3<0> is enabled, the strobe generation circuit 450 may multiply a frequency of the test timing signal R_DQS<0:3> to generate the internal strobe signal IDQS having a frequency higher than the test timing signal R_DQS<0:3>.

The stacked memory device 110 to which the timing control circuits 250 shown in FIGS. 13 to 15 are applied may perform a normal operation and a test operation in the first and second test modes, substantially the same as the operations described in FIGS. 8A to 11, except that the first control circuit 432 is used instead of the output control circuit 330.

Figure 16:
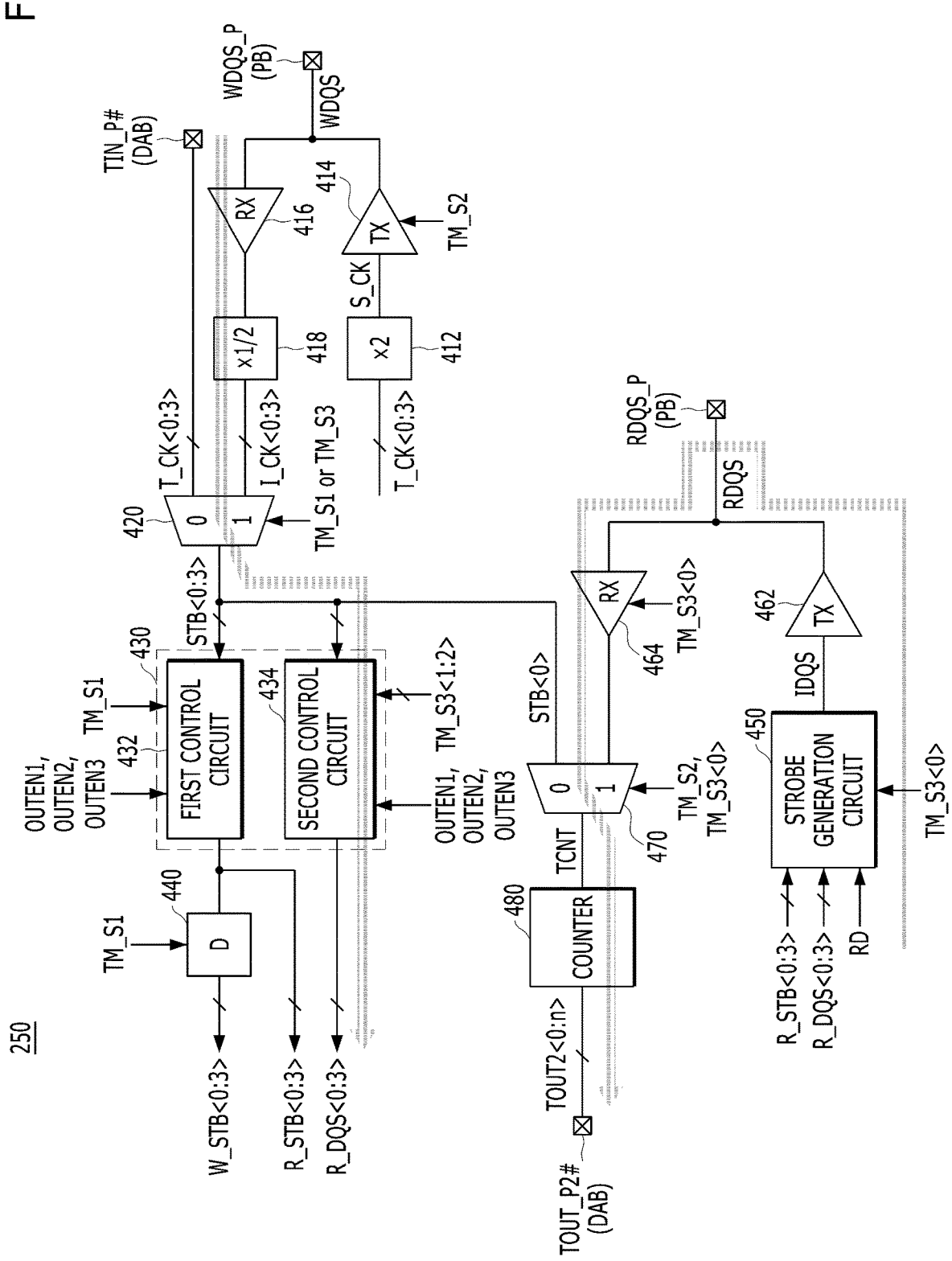
FIG. 16 is a circuit diagram for describing a flow of a read strobe signal during the third test mode in accordance with an embodiment of the present disclosure.

FIG. 16 is a circuit diagram for describing a flow of the read strobe signal RDQS during the third test mode in accordance with an embodiment of the present disclosure. FIGS. 17A to 17D are waveform diagrams for describing an operation of the second control circuit 434 of FIG. 16 in accordance with an embodiment of the present disclosure.

Referring to FIG. 16, the first bit TM_S3<0> of the third test mode signal TM_S3<0:2> is enabled in the third test mode.

The first multiplexer 420 may select a test clock T_CK<0:3> of 4 phases provided through test input pads TIN_P #, to output the seed timing signal STB<0:3>.

The second control circuit 434 may generate the test timing signal R_DQS<0:3> corresponding to the seed timing signal STB<0:3> in response to the first to third output control signals OUTEN1 to OUTEN3, while selectively masking the first to third output control signals OUTEN1 to OUTEN3 according to the pre-amble control signal PRE_EN and the post-amble control signal POST_EN.

Figure 17A:
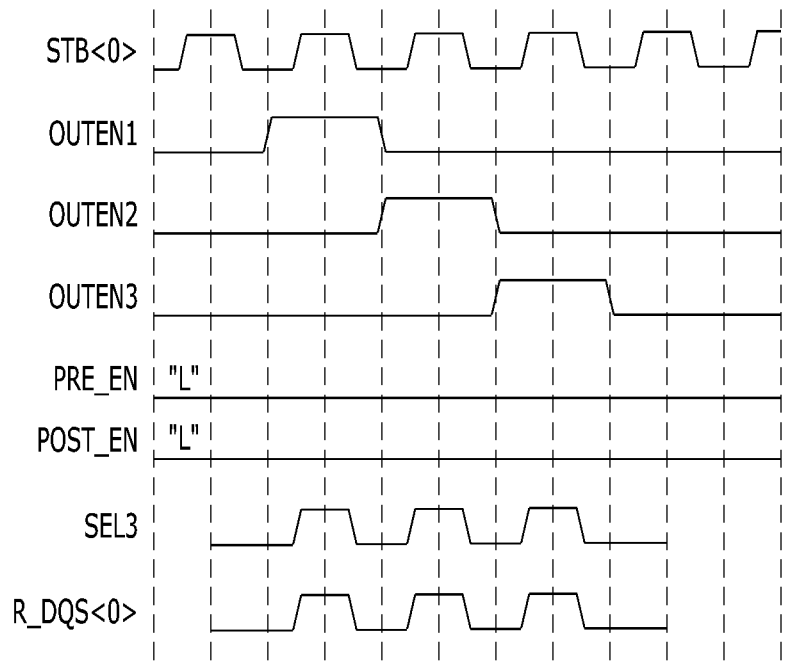
FIGS. 17A to 17D are waveform diagrams for describing an operation of the second control circuit of FIG. 16 in accordance with an embodiment of the present disclosure.

For example, referring to FIG. 17A, in a case where both the pre-amble control signal PRE_EN and the post-amble control signal POST_EN are disabled ("L"), the first and second selection circuits 4342 and 4344 may respectively select and output the first and third output control signals OUTEN1 and OUTEN3. The filter circuit 4346 may generate the selection signal SEL3 corresponding to the seed timing signal STB<0:3> according to the first to third output control signals OUTEN1 to OUTEN3. Thus, the second control circuit 434 may generate the test timing signal R_DQS<0:3> including the pre-amble and the post-amble of the seed timing signal STB<0:3>, in response to the first to third output control signals OUTEN1 to OUTEN3, without masking the first to third output control signals OUTEN1 to OUTEN3.

Figure 17B:
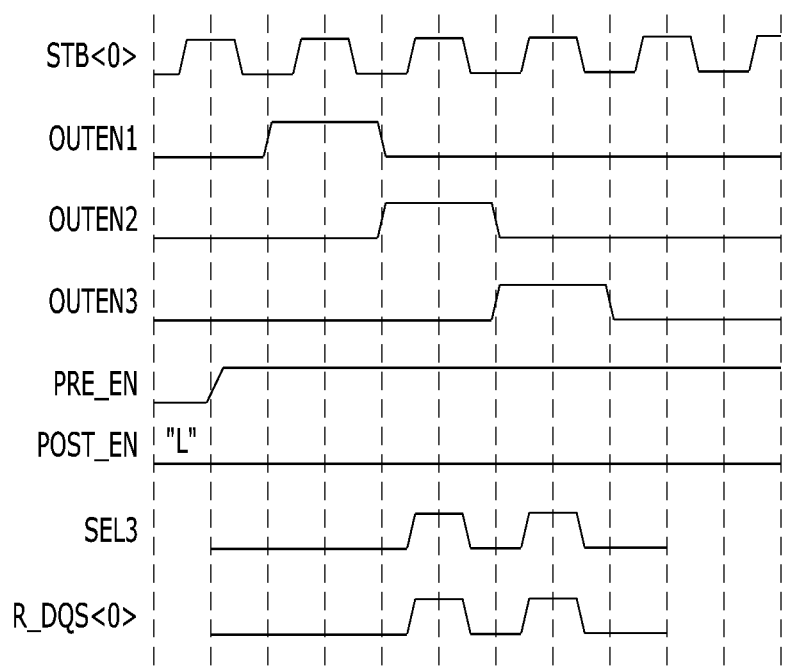

Referring to FIG. 17B, in a case where the pre-amble control signal PRE_EN is enabled, and the post-amble control signal POST_EN is disabled, the second control circuit 434 may mask the first output control signal OUTEN1, and generate the test timing signal R_DQS<0:3> including only the pre-amble of the seed timing signal STB<0:3>, in response to the masked first output control signal OUTEN1 and the second and third output control signals OUTEN2 and OUTEN3.

Figure 17C:
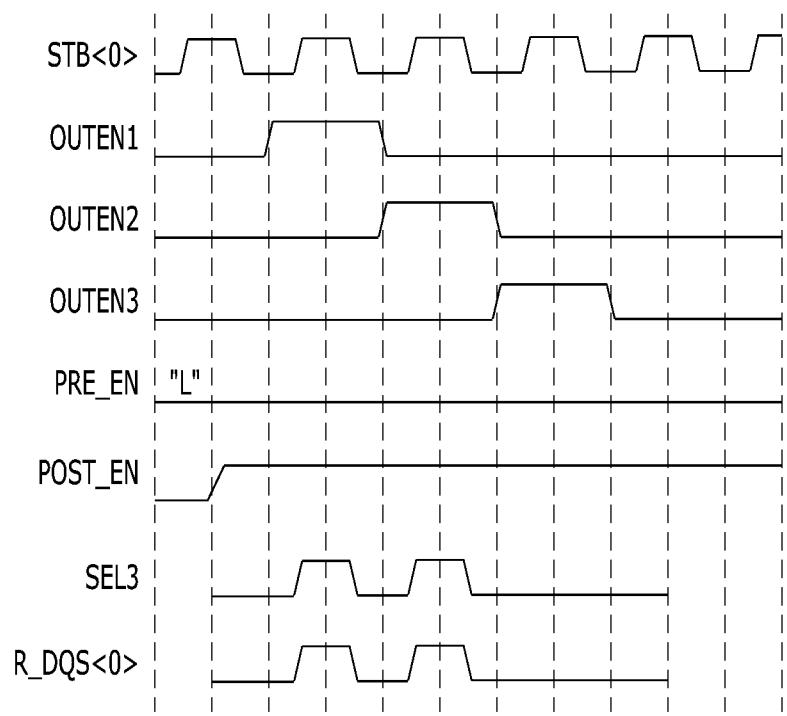

Referring to FIG. 17C, in a case where the pre-amble control signal PRE_EN is disabled, and the post-amble control signal POST_EN is enabled, the second control circuit 434 may mask the third output control signal OUTEN3, and generate the test timing signal R_DQS<0:3> including only the post-amble of the seed timing signal STB<0:3>, in response to the masked third output control signal OUTEN3 and the first and second output control signals OUTEN1 and OUTEN2.

Figure 17D:
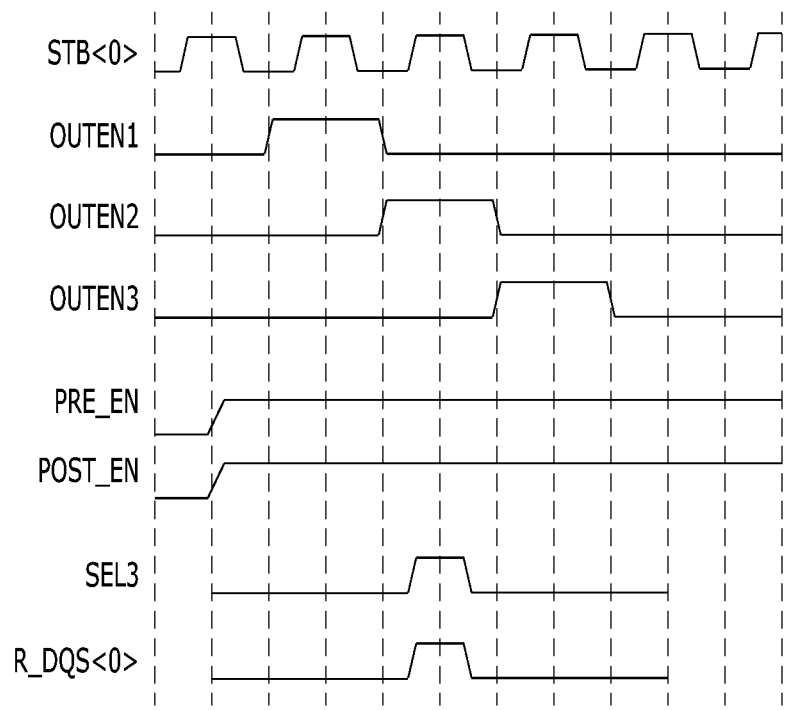

Referring to FIG. 17D, in a case where both the pre-amble control signal PRE_EN and the post-amble control signal POST_EN are enabled, the second control circuit 434 may mask the first and third output control signals OUTEN1 and OUTEN3, and generate the test timing signal R_DQS<0:3> excluding the pre-amble and the post-amble of the seed timing signal STB<0:3>, in response to the first to third output control signals OUTEN1 to OUTEN3.

Referring back to FIG. 16, the strobe generation circuit 450 may generate the internal strobe signal IDQS by multiplying a frequency of the test timing signal R_DQS<0:3>. The second output circuit 462 may output the internal strobe signal IDQS as the read strobe signal RDQS through the read strobe pad RDQS_P. The second input circuit 464 may receive the read strobe signal RDQS fed back through the read strobe pad RDQS_P.

The second multiplexer 470 may output a target counting signal TCNT by selecting the read strobe signal RDQS. The counter 480 may generate a counting signal TOUT2<0:n> by counting the toggling number of the target counting signal TCNT, and output the respective bits of the counting signal TOUT2<0:n> to the test device through second test output pads TOUT_P2 #. The test device may verify the strobe generation circuit 450, the second output circuit 462, and the read strobe pad RDQS_P, based on the counting signal TOUT2<0:n>.

As described above, according to an embodiment of the present disclosure, the memory device may generate the test timing signal R_DQS<0:3> by selectively adjusting the pre-amble and post-amble of the test clock T_CK<0:3> provided through the test input pads TIN_P #, and evaluate and verify the read strobe pad RDQS_P and circuits relating thereto using the test timing signal R_DQS<0:3>. Thus, the memory device may improve the reliability of the test operation and the test performance thereof.

While the present teachings have been described with respect to specific embodiments, it will be apparent to those skilled in the art that various changes and modifications may be made without departing from the spirit and scope of the present disclosure as defined in the following claims.

For example, the logic gates and transistors described in the above embodiments may have different positions and types according to the polarity of input signals. Furthermore, the embodiments may be combined to form additional embodiments.

What is claimed is:

1. A memory device, comprising:
   at least one data pad;
   a read circuit suitable for outputting read data or test data to the data pad in synchronization with a read timing signal, according to a read command;
   a write circuit suitable for receiving write data through the data pad in synchronization with a write timing signal;
   a test register circuit suitable for performing a preset operation on data outputted from the write circuit and storing therein the preset-operated data, and transferring the stored data as the test data in response to the read command, during a first test mode;
   a data compression circuit suitable for generating a test output signal by compressing the test data outputted from the read circuit and outputting the test output signal to a first test output pad, during the first test mode; and
   a timing control circuit suitable for generating, according to first to third output control signals, the read timing signal corresponding to a test clock inputted from at least one test input pad and generating the write timing signal by delaying the read timing signal, during the first test mode.

2. The memory device of claim 1, wherein the timing control circuit generates the read timing signal without a pre-amble and a post-amble, according to the first to third output control signals, during the first test mode.

3. The memory device of claim 1, further comprising:
   a first strobe pad through which a write strobe signal is inputted; and
   a second strobe pad through which a read strobe signal is outputted.

4. The memory device of claim 3,
   wherein the memory device includes a first area interfacing with a controller, a second area interfacing with through-electrodes, and a third area interfacing with a test device, and
   wherein the data pad, and the first and second strobe pads are disposed in the first area, and the first test output pad and the test input pad are disposed in the third area.

5. The memory device of claim 3, wherein the timing control circuit includes:
   a first multiplexer suitable for outputting a seed timing signal by selecting, in response to a first test mode signal, one of the test clock and the write strobe signal inputted through the first strobe pad;
   an output control circuit suitable for generating the read timing signal corresponding to the seed timing signal in response to the first to third output control signals, while selectively masking the first to third output control signals in response to the first test mode signal; and
   a delay suitable for outputting the write timing signal by delaying the read timing signal by a delay time amount according to the first test mode signal.

6. The memory device of claim 5, wherein the output control circuit includes:
   a first selection circuit suitable for selecting one of the first output control signal and a ground level signal in response to the first test mode signal;
   a second selection circuit suitable for selecting one of the third output control signal and the ground level signal in response to the first test mode signal;
   a filter circuit suitable for generating a selection signal by filtering a section of the seed timing signal according to the second output control signal, and output signals of the first and second selection circuits; and
   a third selection circuit suitable for outputting the read timing signal by selecting one of a source level signal and the ground level signal in response to the selection signal.

7. The memory device of claim 3, wherein, during a second test mode, the timing control circuit is further suitable for:
   generating a test seed clock using the test clock inputted through the test input pad,
   feeding back the test seed clock as the write strobe signal through the first strobe pad, and
   generating a counting signal by counting a toggling number of the fed-back write strobe signal and outputting respective bits of the counting signal to at least one second test output pad.

8. The memory device of claim 7, wherein the timing control circuit includes:
   a clock multiplier suitable for generating the test seed clock by multiplying a frequency of the test clock;
   a first output circuit suitable for outputting the test seed clock as the write strobe signal to the first strobe pad in response to a second test mode signal;
   a first input circuit suitable for receiving the write strobe signal transferred through the first strobe pad;
   a clock divider suitable for generating an internal clock by dividing a frequency of the write strobe signal transferred from the first input circuit;
   a first multiplexer suitable for outputting a seed timing signal by selecting, in response to a first test mode signal, one of the test clock and the internal clock;
   a counter suitable for generating the counting signal by counting a toggling number of the seed timing signal and outputting the respective bits of the counting signal to the second test output pad;
   an output control circuit suitable for generating the read timing signal corresponding to the seed timing signal in response to the first to third output control signals, while selectively masking the first to third output control signals in response to the first test mode signal; and
   a delay suitable for outputting the write timing signal by delaying the read timing signal by a delay time amount according to the first test mode signal.

9. The memory device of claim 3, wherein, during a third test mode, the timing control circuit is further suitable for:
   generating, according to the first to third output control signals, the read timing signal corresponding to the test clock inputted through the test input pad,
   generating an internal strobe signal based on the read timing signal and feeding back the internal strobe signal as the read strobe signal through the second strobe pad, and
   generating a counting signal by counting a toggling number of the fed-back read strobe signal and outputting respective bits of the counting signal to at least one second test output pad.

10. The memory device of claim 9, wherein the timing control circuit includes:
- a first multiplexer suitable for outputting a seed timing signal by selecting, in response to a first test mode signal and a third test mode signal, one of the test clock and the write strobe signal transferred through the first strobe pad;
- an output control circuit suitable for generating the read timing signal corresponding to the seed timing signal in response to the first to third output control signals, while selectively masking the first to third output control signals in response to the first test mode signal and the third test mode signal;
- a delay suitable for outputting the write timing signal by delaying the read timing signal by a delay time amount according to the first test mode signal;
- a strobe generation circuit suitable for generating the internal strobe signal based on the read timing signal;
- a second output circuit suitable for outputting the internal strobe signal as the read strobe signal to the second strobe pad;
- a second input circuit suitable for receiving, in response to the third test mode signal, the read strobe signal transferred through the second strobe pad; and
- a counter suitable for generating the counting signal by counting the toggling number of the read strobe signal and outputting the respective bits of the counting signal to the second test output pad.

11. The memory device of claim 9, wherein the timing control circuit generates the read timing signal without a pre-amble and a post-amble, according to the first to third output control signals, during the third test mode.

12. The memory device of claim 1,
wherein the read circuit includes:
- a read register circuit suitable for storing the read data or the test data, according to the read command, and outputting the stored data as parallel data;
- a first alignment circuit suitable for serializing the parallel data based on the read timing signal; and
- an output circuit suitable for outputting the serialized data through the data pad, and wherein the data compression circuit generates the test output signal by compressing the parallel data outputted from the read register circuit.

13. The memory device of claim 1,
wherein the write circuit includes:
- an input circuit suitable for receiving the write data through the data pad;
- a second alignment circuit suitable for aligning, in parallel, data outputted from the input circuit, based on the write timing signal, and outputting the parallel data; and
- a write register circuit suitable for storing therein the parallel data according to a write command, and wherein the test register circuit performs the preset operation on the parallel data outputted from the second alignment circuit, and stores therein the preset-operated parallel data.

14. The memory device of claim 1, wherein the test register circuit includes a multiple input shift register or a multiple input signature register (MISR) circuit.

15. A memory device, comprising:
- a first strobe pad through which a write strobe signal inputted;
- a clock multiplier suitable for receiving a test clock inputted from at least one test input pad and generating a test seed clock by multiplying a frequency of the test clock;
- a first output circuit suitable for outputting the test seed clock as the write strobe signal to the first strobe pad in response to a second test mode signal;
- a first input circuit suitable for receiving the write strobe signal transferred through the first strobe pad;
- a clock divider suitable for generating an internal clock by dividing a frequency of the write strobe signal transferred from the first input circuit; and
- a counter suitable for generating a counting signal by counting a toggling number of the internal clock and outputting respective bits of the counting signal to at least one test output pad.

16. The memory device of claim 15, further comprising:
- a second strobe pad through which a read strobe signal is outputted;
- a second output circuit suitable for outputting an internal strobe signal as the read strobe signal to the second strobe pad;
- a second input circuit suitable for receiving, in response to a third test mode signal, the read strobe signal transferred through the second strobe pad; and
- a second multiplexer suitable for outputting, to the counter, one of the internal clock and the read strobe signal in response to the second test mode signal and the third test mode signal.

17. The memory device of claim 16,
wherein the memory device includes a first area interfacing with a controller, a second area interfacing with through-electrodes, and a third area interfacing with a test device, and
wherein the first strobe pad and the second strobe pad are disposed in the first area and the test output pad and the test input pad are disposed in the third area.

18. A memory device, comprising:
- a second strobe pad through which a read strobe signal is outputted;
- an output control circuit suitable for receiving a test clock inputted from at least one test input pad and generating a read timing signal corresponding to the test clock in response to first to third output control signals, while selectively masking the first to third output control signals in response to a third test mode signal;
- a strobe generation circuit suitable for generating an internal strobe signal based on the read timing signal;
- a second output circuit suitable for outputting the internal strobe signal as the read strobe signal to the second strobe pad;
- a second input circuit suitable for receiving, in response to the third test mode signal, the read strobe signal transferred through the second strobe pad; and
- a counter suitable for generating a counting signal by counting the toggling number of the read strobe signal and outputting respective bits of the counting signal to at least one test output pad.

19. The memory device of claim 18, wherein the output control circuit includes:
- a first selection circuit suitable for selecting one of the first output control signal and a ground level signal in response to the third test mode signal;
- a second selection circuit suitable for selecting one of the third output control signal and the ground level signal in response to the third test mode signal;

a filter circuit suitable for generating a selection signal by filtering a section of the test clock according to output signals of the first selection circuit, the second selection circuit, and the second output control signal; and a third selection circuit suitable for outputting the read timing signal by selecting one of a source level signal and the ground level signal in response to the selection signal.

20. The memory device of claim 18, wherein the memory device includes a first area interfacing with a controller, a second area interfacing with through-electrodes, and a third area interfacing with a test device, and wherein the second strobe pad is disposed in the first area and the test output pad and the test input pad are disposed in the third area.

* * * * *